US012796028B2

(12) United States Patent
Chen et al.

(10) Patent No.: US 12,796,028 B2
(45) Date of Patent: Nov. 10, 2026

(54) SEMICONDUCTOR STRUCTURE AND METHOD FOR FORMING THE SAME

(71) Applicant: TAIWAN SEMICONDUCTOR MANUFACTURING COMPANY, LTD., Hsinchu (TW)

(72) Inventors: Hong-Chih Chen, Changhua County (TW); Fu-Hsiang Su, Zhubei City (TW); Chia-Hao Kuo, Taoyuan City (TW); Shih-Hsun Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 340 days.

(21) Appl. No.: 18/582,429

(22) Filed: Feb. 20, 2024

(65) Prior Publication Data

US 2025/0267906 A1 Aug. 21, 2025

(51) Int. Cl.

| | |
|---|---|
| ***H10D 30/43*** | (2025.01) |
| ***H10D 30/01*** | (2025.01) |
| ***H10D 30/67*** | (2025.01) |
| ***H10D 62/10*** | (2025.01) |
| ***H10W 10/00*** | (2026.01) |
| ***H10W 10/17*** | (2026.01) |
| ***H10W 20/00*** | (2026.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10W 10/014* (2026.01); *H10W 10/17* (2026.01); *H10W 20/089* (2026.01)

(58) Field of Classification Search

CPC ............... H10D 62/121; H10D 30/014; H10D 30/6757; H10D 30/6735; H10D 30/43; H10W 10/01

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Trang Q Tran

(74) *Attorney, Agent, or Firm* — Birch, Stewart, Kolasch & Birch, LLP

(57) ABSTRACT

Semiconductor structures and methods for manufacturing the same are provided. The semiconductor structure includes first nanostructures and second nanostructures formed over the substrate along the first direction. The semiconductor structure includes a first gate structure formed over the first nanostructures along a second direction, and a second gate structure formed over the second nanostructures. The semiconductor structure includes an isolation wall structure between the first gate structure and the second gate structure, and the isolation wall structure has a first sidewall surface and a second sidewall surface. There is a first distance between the sidewall surface of the topmost first nanostructure and the first sidewall surface of the isolation wall structure, and there is a second distance between a sidewall surface of the topmost first nanostructure and the second sidewall surface of the isolation wall structure. The first distance is greater than the second distance.

20 Claims, 51 Drawing Sheets

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0159311 | A1* | 5/2021 | Lan | B82Y 10/00 |

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 3A-2 to 3L-2 illustrate cross-sectional representations of various stages of manufacturing the semiconductor structure shown along line B-B' in FIGS. 1E and 1*n* FIG. 2, in accordance with some embodiments.

FIGS. 3A-3 to 3L-3 illustrate cross-sectional representations of various stages of manufacturing the semiconductor structure shown along line C-C in FIGS. 1E and 1*n* FIG. 2, in accordance with some embodiments.

DETAILED DESCRIPTION

Figure 1A:
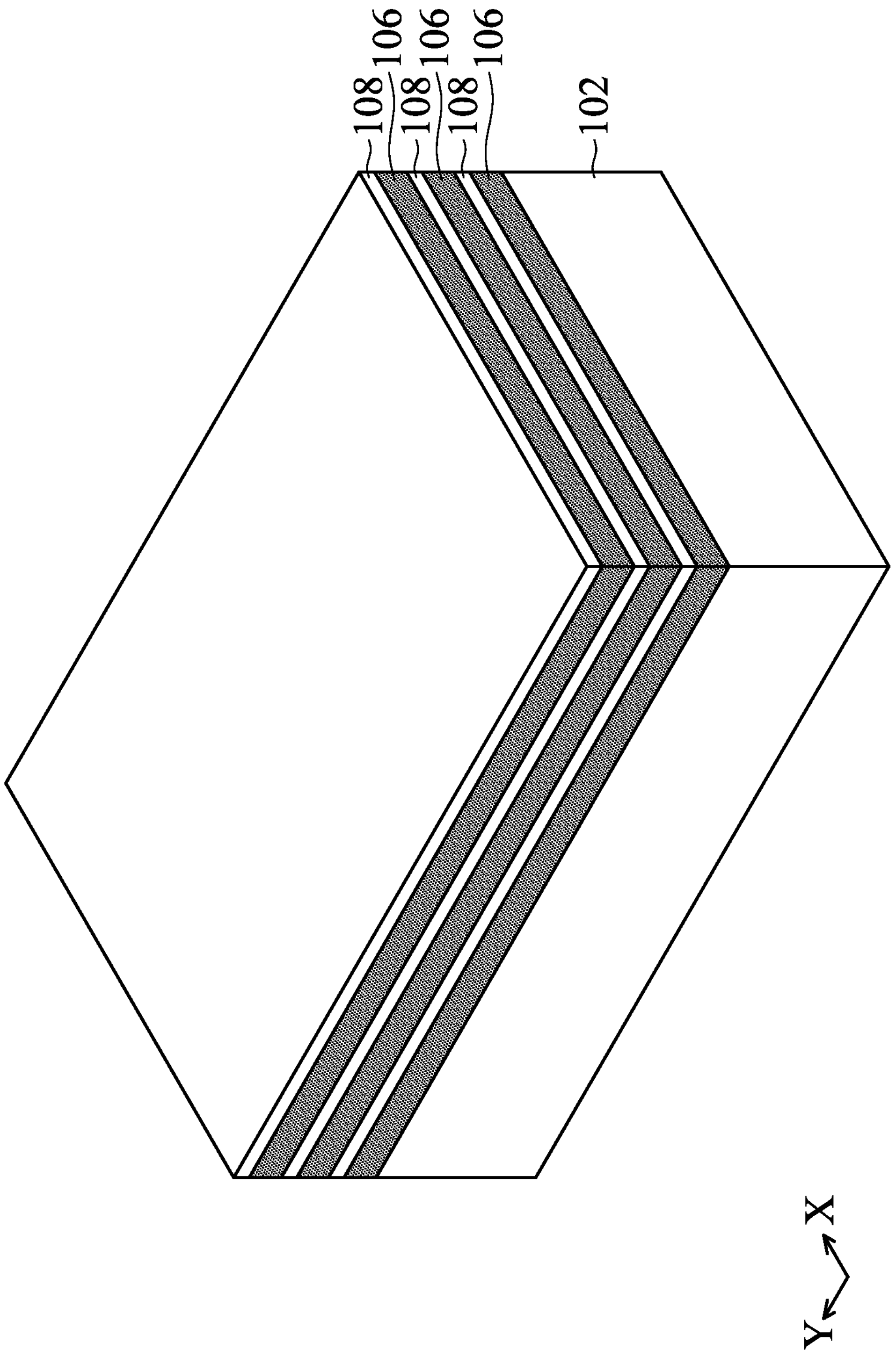
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structure includes a first fin structure and a second fin structure formed over a substrate. The first fin structure includes first nanostructures, and the second fin structure includes second nanostructures along the first direction (e.g. the X-axis). A first gate structure formed over the first nanostructures and a second gate structure formed over the second nanostructures. A first S/D structure is adjacent to the first gate structure. A first isolation wall structure formed through the first gate structure, and a second isolation wall structure formed through the second gate structure. There is the first distance between the sidewall surface of the topmost first nanostructure and the sidewall surface of the first isolation wall structure along the second direction. There is the second distance between the sidewall surface of the topmost second nanostructure and the sidewall surface of the second isolation wall structure along the second direction, and the first distance is greater than the second distance. Since the first distance is greater than the second distance, the risk of damage to the first gate structure in the etching process for forming the isolation wall structure may reduce, while the parasitic capacitance may reduce. Therefore, the performance and the manufacturing yield of the semiconductor device are improved.

The source/drain (S/D) structure or region(s) may refer to a source or a drain, individually or collectively dependent upon the context.

FIGS. 1A to 1E illustrate perspective views of intermediate stages of manufacturing a semiconductor structure 100*a*, in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
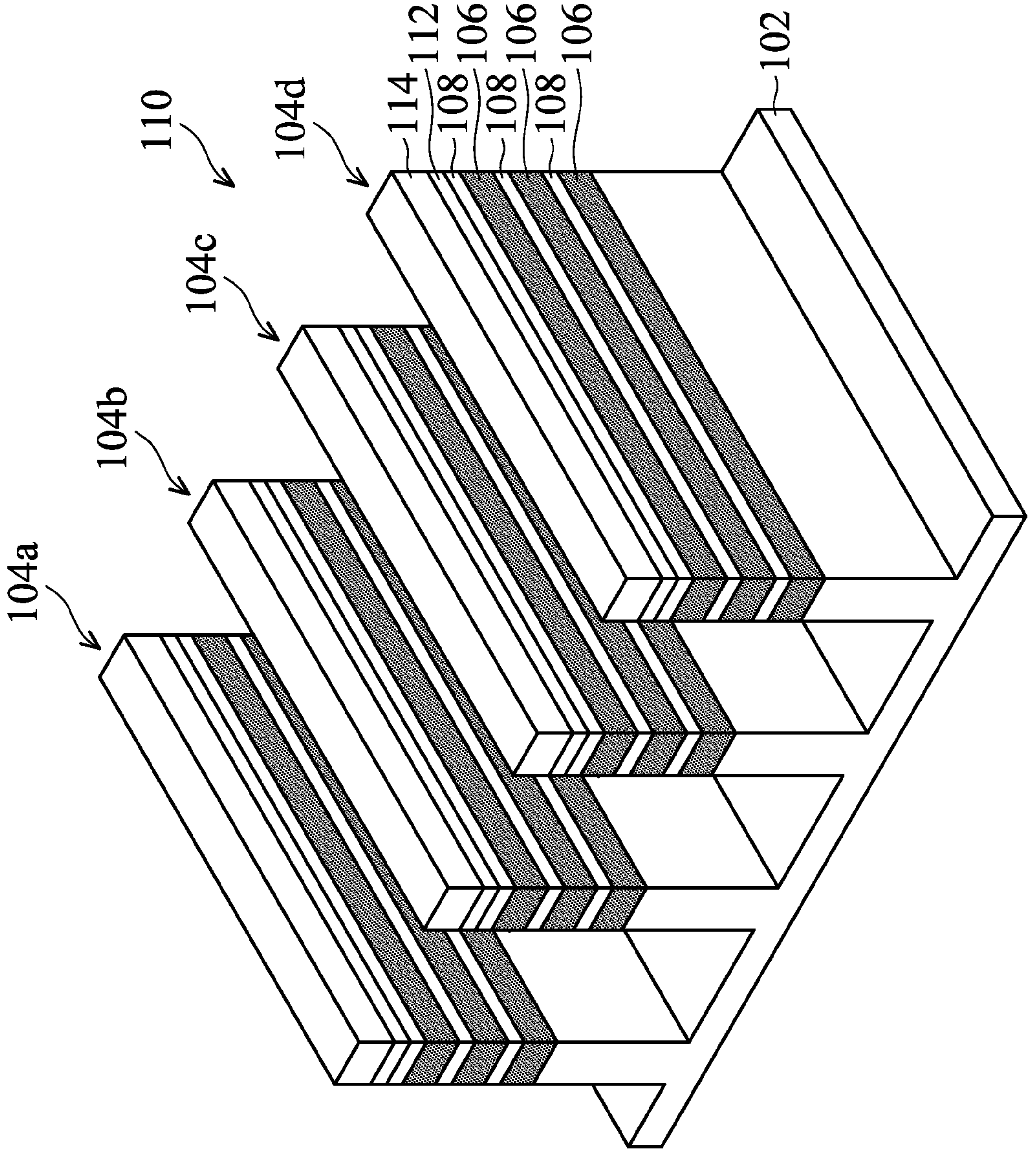

Afterwards, as shown in FIG. 1B, after the first semiconductor material layers 106 and the second semiconductor material layers 108 are formed as a semiconductor material stack over the substrate 102, the semiconductor material stack is patterned to form a first fin structure 104*a*, a second fin structure 104*b*, a third fin structure 104*c* and a fourth fin structure 104*d*, in accordance with some embodiments. In some embodiments, each of the first fin structure 104*a*, the second fin structure 104*b*, the third fin structure 104*c* and the fourth fin structure 104*d* includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
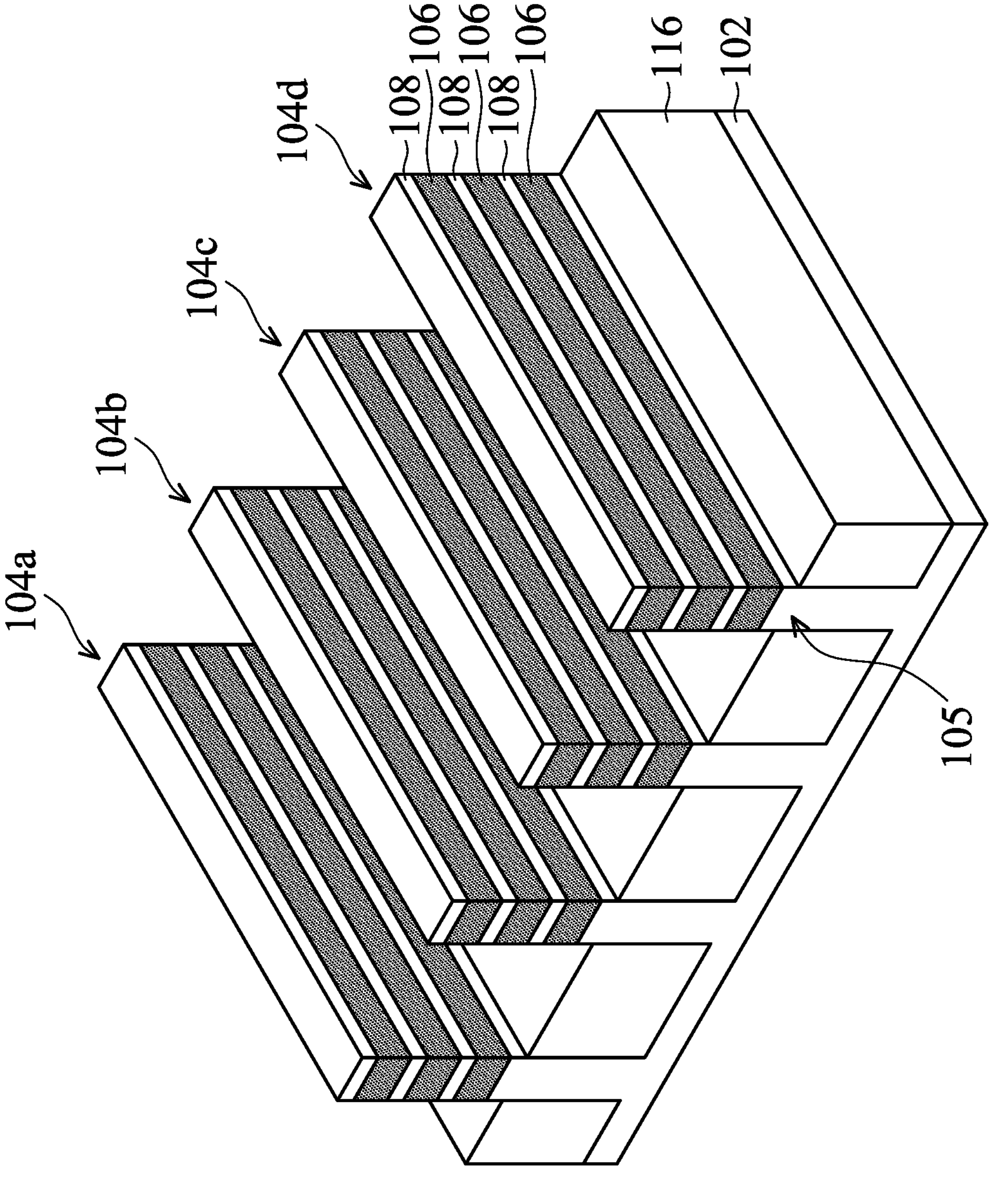

Next, as shown in FIG. 1C, after the first fin structure 104*a*, the second fin structure 104*b*, the third fin structure 104*c* and the fourth fin structure 104*d* are formed, an isolation structure 116 is formed around first fin structure 104*a*, the second fin structure 104*b*, the third fin structure 104*c* and a fourth fin structure 104*d*, and the mask structure 110 is removed, in accordance with some embodiments. The isolation structure 116 is configured to electrically isolate active regions (e.g. the first fin structure 104*a*, the second fin structure 104*b*, the third fin structure 104*c* and the fourth fin structure 104*d*) of the semiconductor structure 100*a* and is also referred to as shallow trench isolation (STI) feature in accordance with some embodiments.

The isolation structure 116 may be formed by depositing an insulating layer over the substrate 102 and recessing the insulating layer so that the first fin structure 104*a*, the second fin structure 104*b*, the third fin structure 104*c* and the fourth fin structure 104*d* are protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
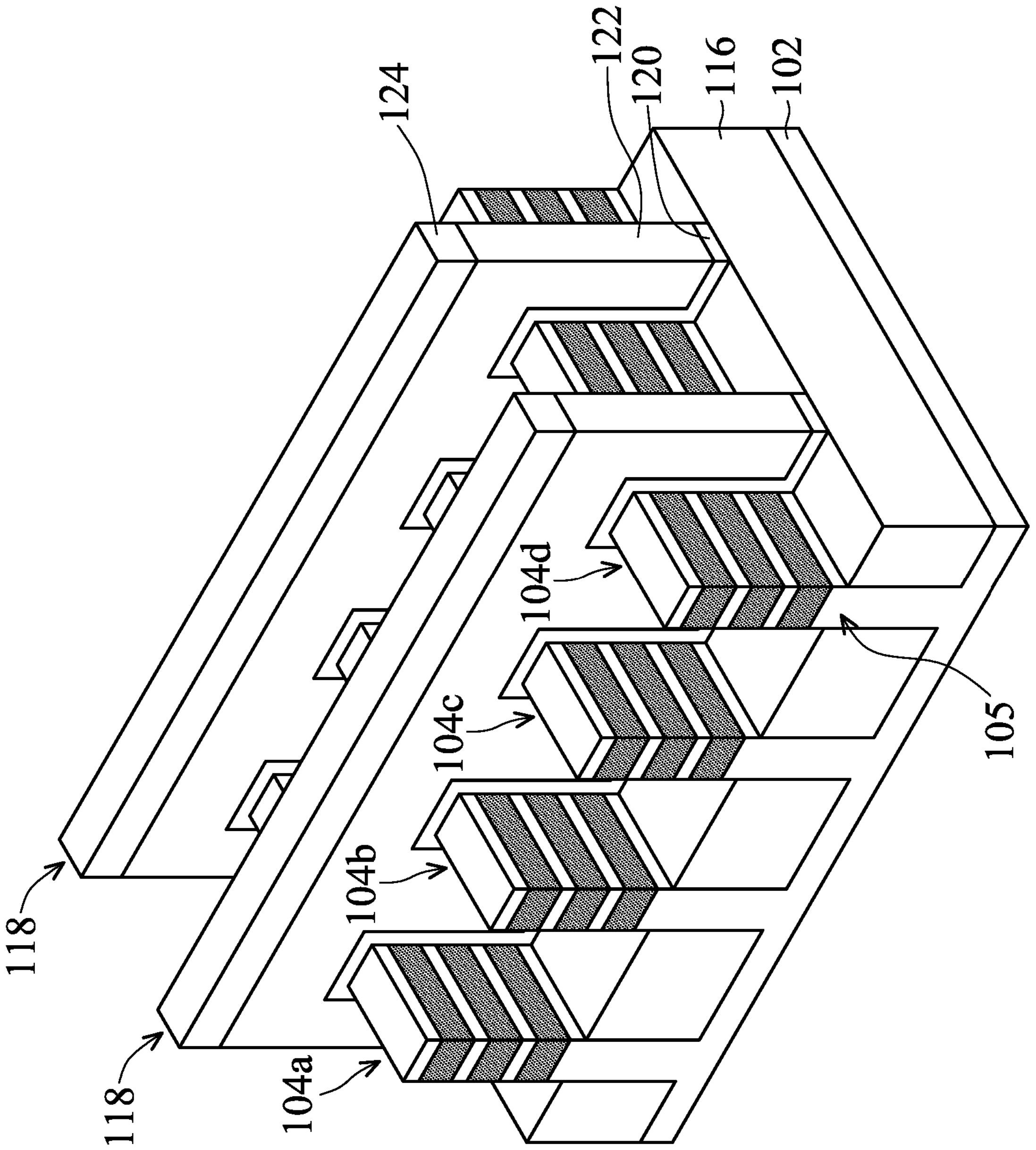

Afterwards, as shown in FIG. 1D, after the isolation structure 116 is formed, dummy gate structures 118 are formed across the first fin structure 104*a*, the second fin structure 104*b*, the third fin structure 104*c* and the fourth fin structure 104*d* and extend over the isolation structure 116, in accordance with some embodiments. The dummy gate structures 118 may be used to define the source/drain (S/D) regions and the channel regions of the resulting semiconductor structure 100*a*.

In some embodiments, the first dummy gate structure 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
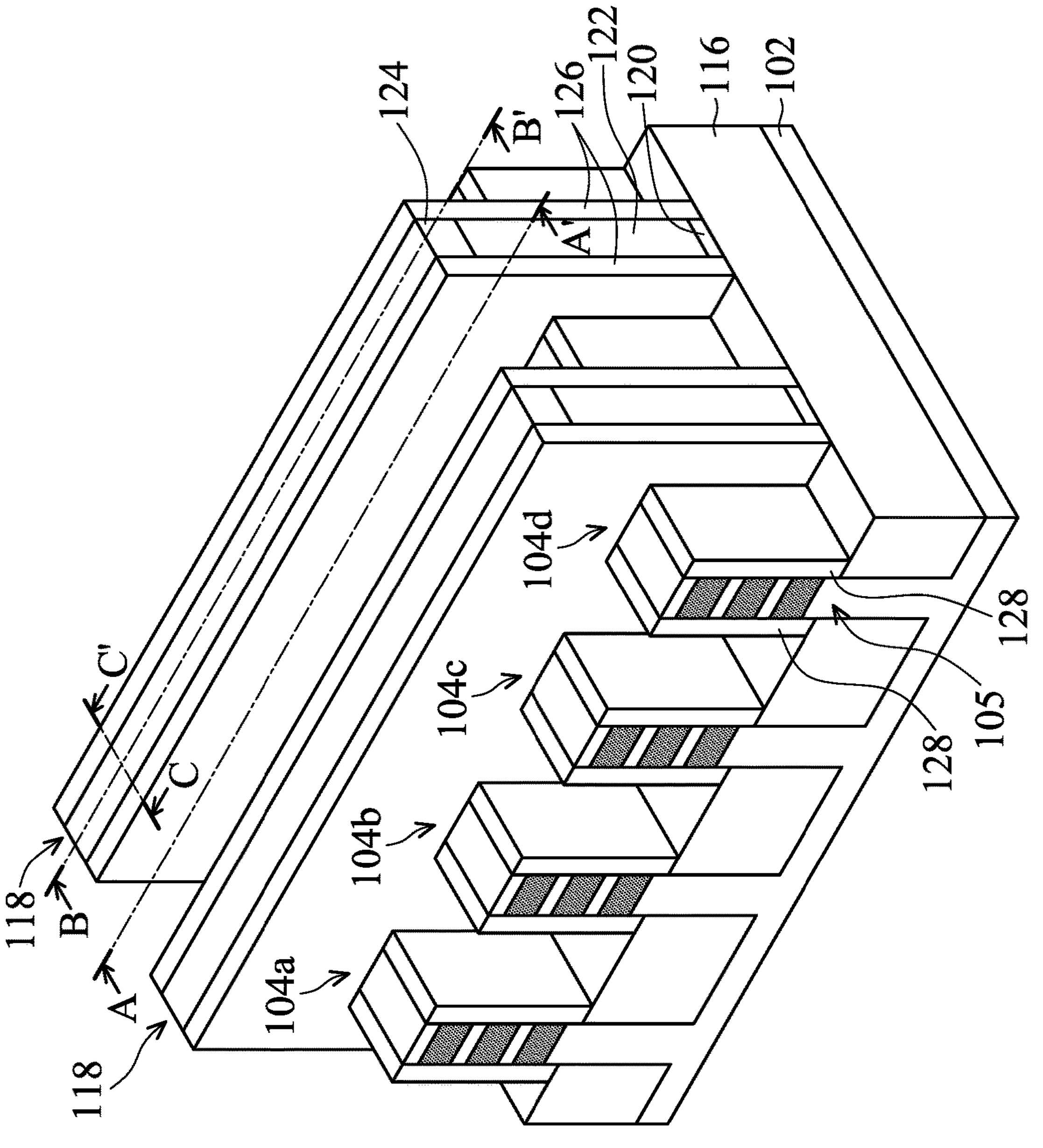

Next, as shown in FIG. 1E, after the dummy gate structures 118 are formed, gate spacer layers 126 are formed along and covering opposite sidewalls of the dummy gate structure 118 and fin spacer layers 128 are formed along and covering opposite sidewalls of the source/drain regions of the fin structure 104, in accordance with some embodiments.

The gate spacer layers 126 may be configured to separate source/drain (S/D) structures from the dummy gate structures 118, and support the dummy gate structures 118, and the fin space layers 128 may be configured to constrain a lateral growth of subsequently formed source/drain structure and support the first fin structure 104*a* and the second fin structure 104*b*.

In some embodiments, the gate spacer layers 126 and the fin spacer layers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126 and the fin spacer layers 128 may include conformally depositing a dielectric material covering the dummy gate structures 118, the first fin structure 104*a*, the second fin structure 104*b* and the isolation structure 116 over the substrate 102, and performing an anisotropic etching process, such as dry plasma etching, to remove the dielectric layer covering the top surfaces of the gate structures 118, the first fin structure 104*a*, the second fin structure 104*b*, and portions of the isolation structure 116.

Figure 2:
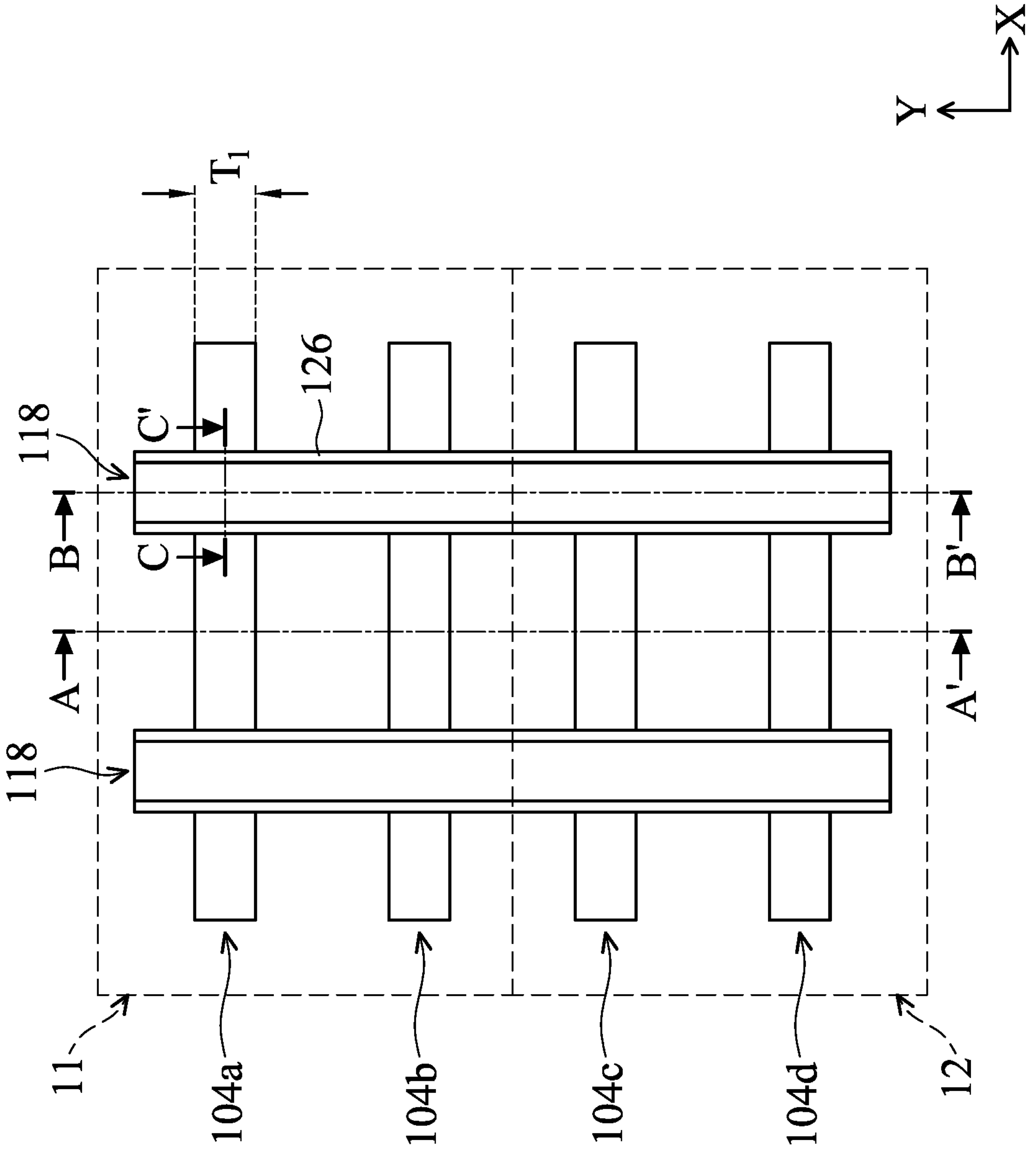
FIG. 2 shows a top-view representation of the semiconductor structure, in accordance with some embodiments.

FIG. 2 shows a top-view representation of the semiconductor structure 100*a*, in accordance with some embodiments. As shown in FIG. 2, the substrate 102 includes a first region 11 and a second region 12. The first fin structure 104*a* and the second fin structure 104*b* are formed in the first region 11 along the first direction (e.g. the X-axis), the third fin structure 104*c* and the fourth fin structure 104*d* are formed in the second region 12 along the first direction (e.g. the X-axis).

The dummy gate structures 118 are formed along a second direction (e.g. the Y-axis). The dummy gate structures 118 are formed across the first fin structure 104*a*, the second fin structure 104*b*, the third fin structure 104*c* and the fourth fin structure 104*d*. The gate spacer layers 126 are formed on opposite sidewall surfaces of the dummy gate structures 118 along the second direction (e.g. the Y-axis). In some embodiments, each of the first fin structure 104*a*, the second fin structure 104*b*, the third fin structure 104*c* and the fourth fin structure 104*d* has a width of Ti in the second direction (e.g. the Y-axis). In some embodiments, the width Ti is in a range from about 8 nm to about 60 nm.

Figures 1, 3A:
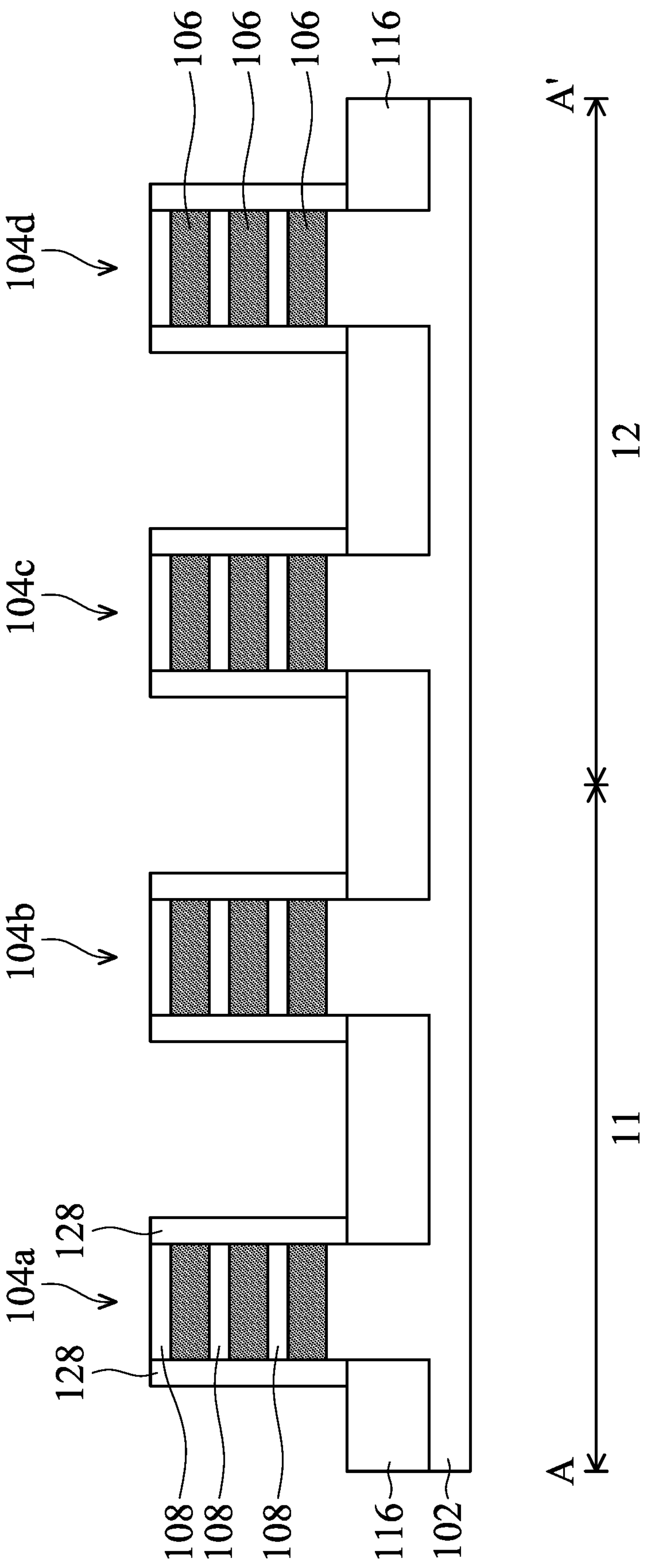
FIGS. 3A-1 to 3L-1 illustrate cross-sectional representations of various stages of manufacturing the semiconductor structure shown along line A-A' in FIGS. 1E and 1*n* FIG. 2, in accordance with some embodiments.
Figures 2, 3A:
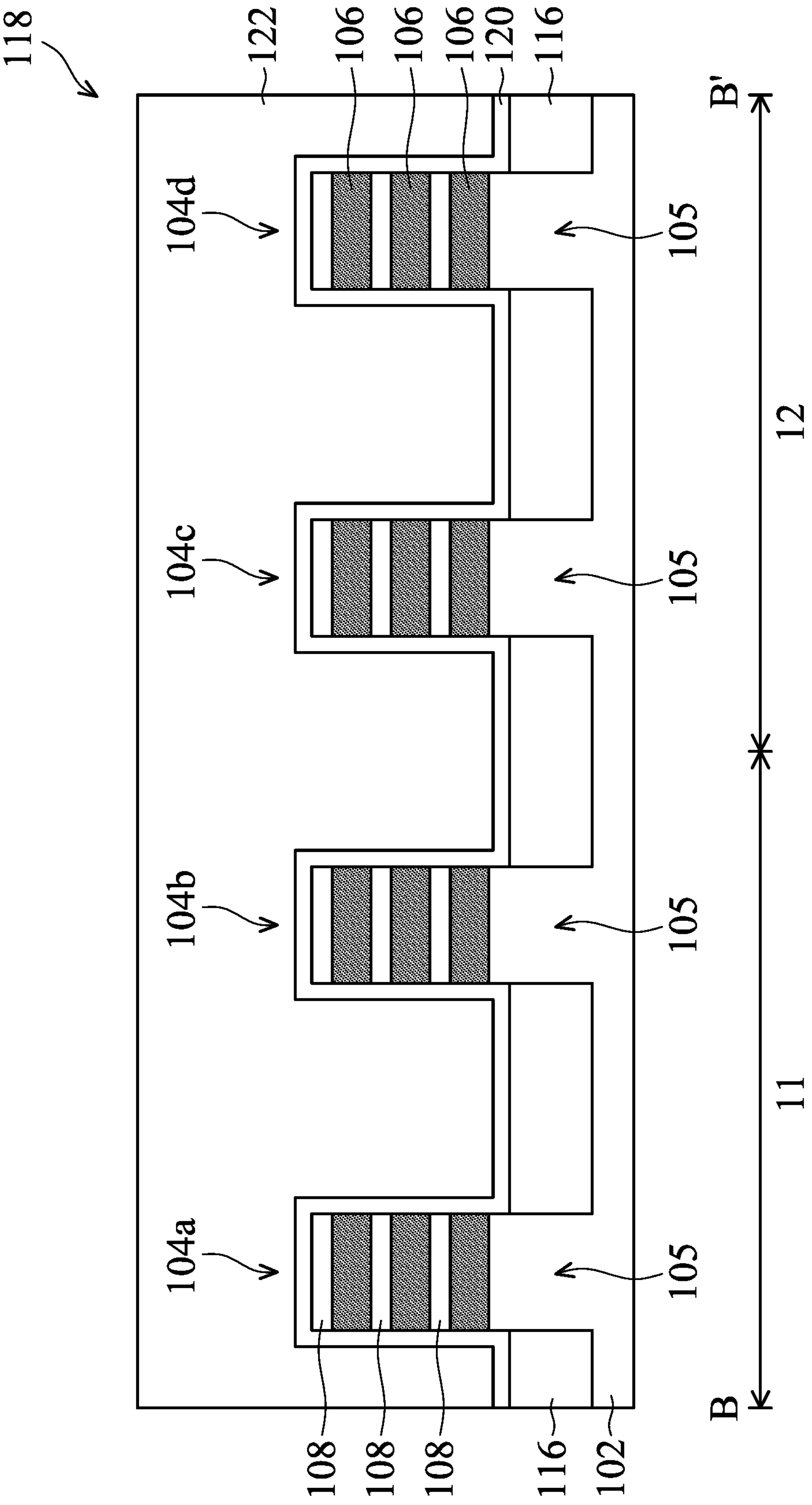
Figures 3, 3A:
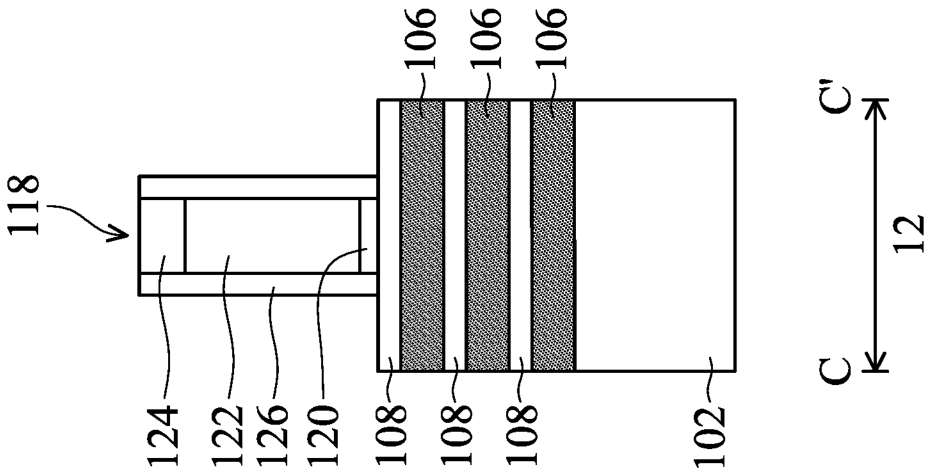
Figures 1, 3B:
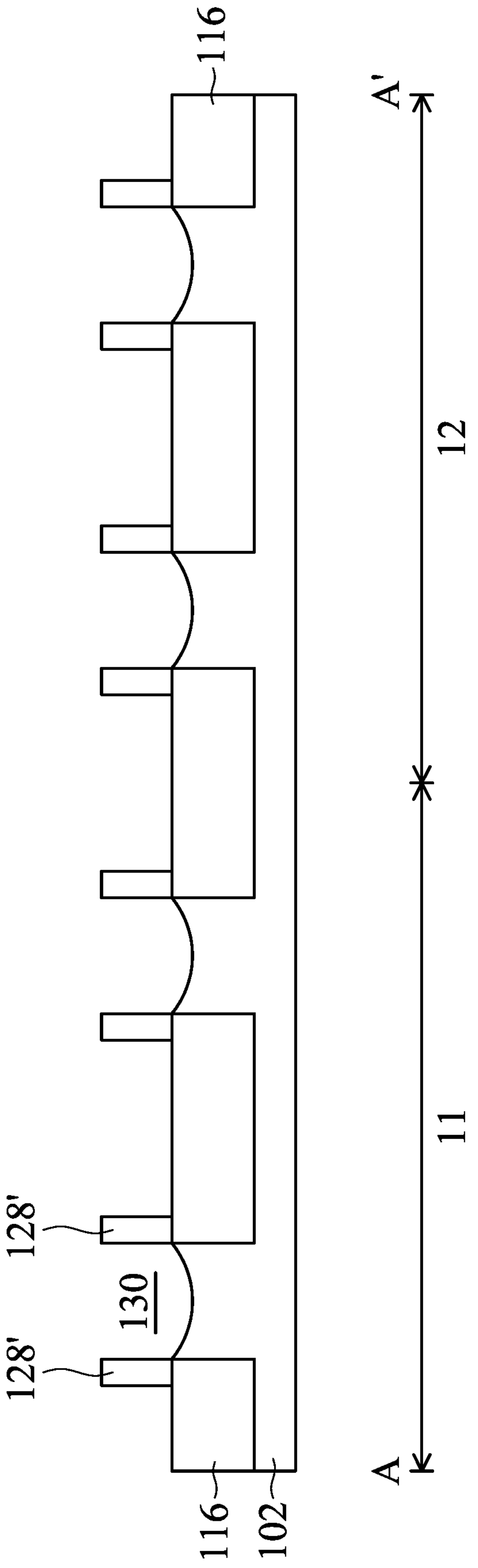
Figures 2, 3B:
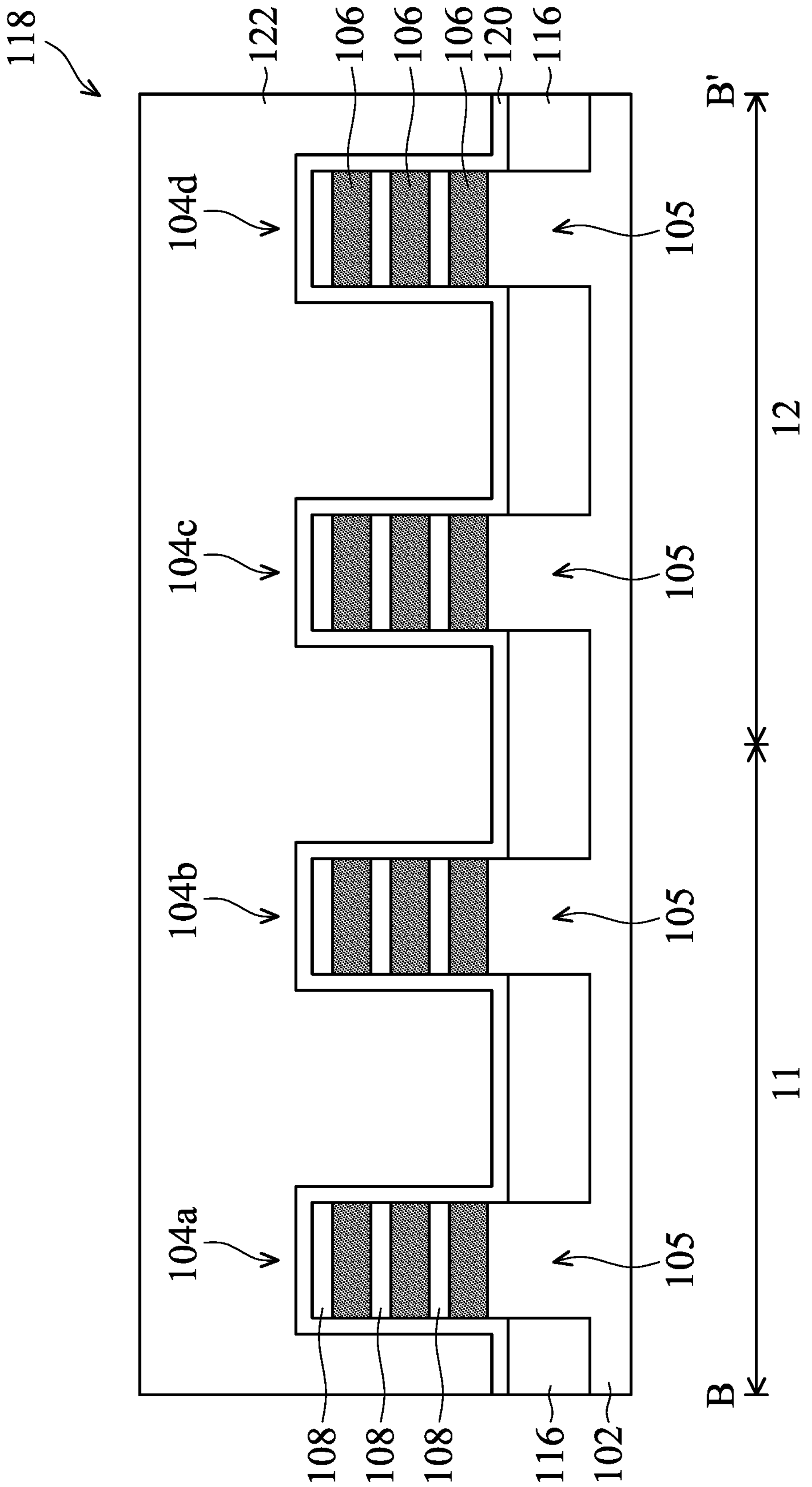
Figures 3, 3B:
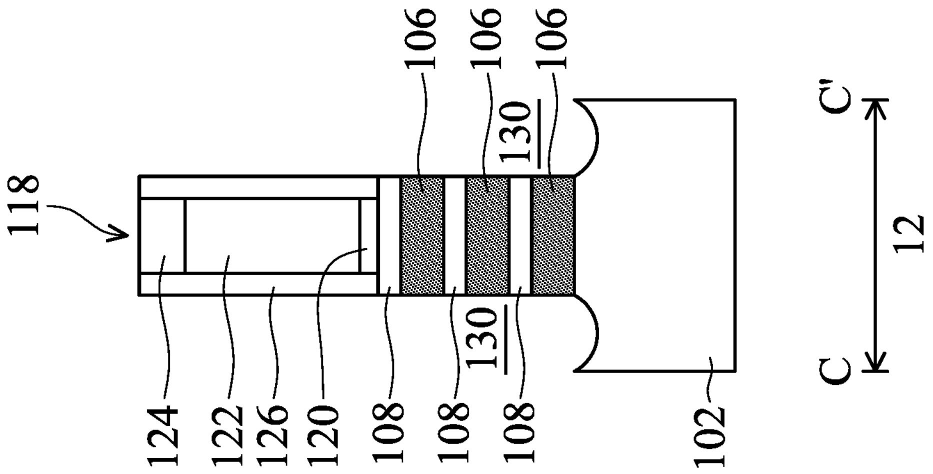
Figures 1, 3C:
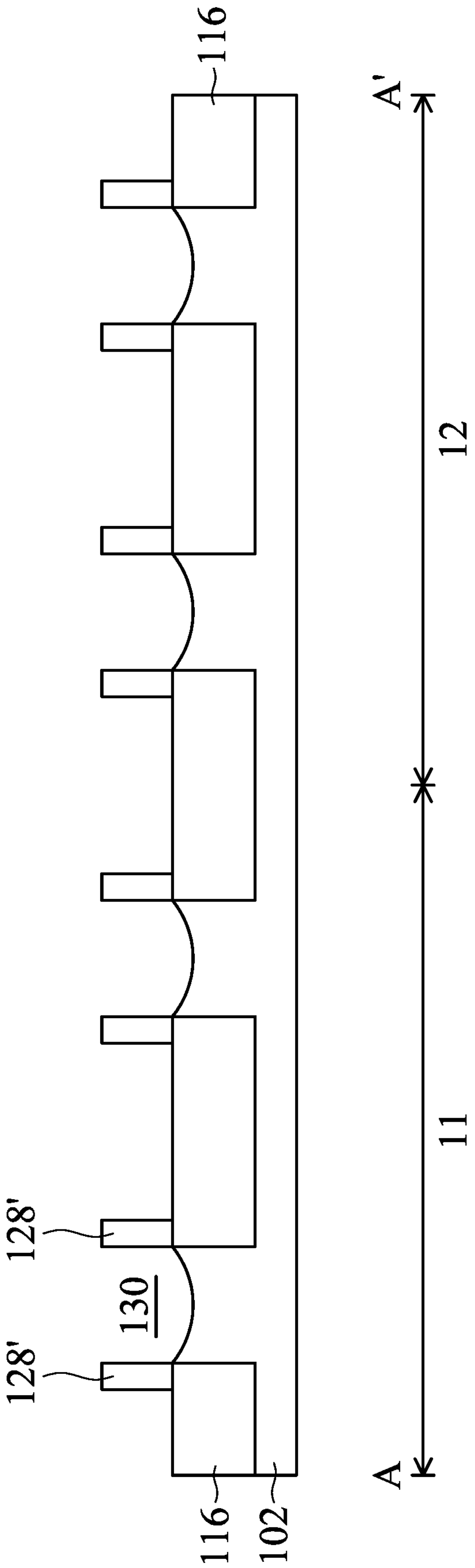
Figures 2, 3C:
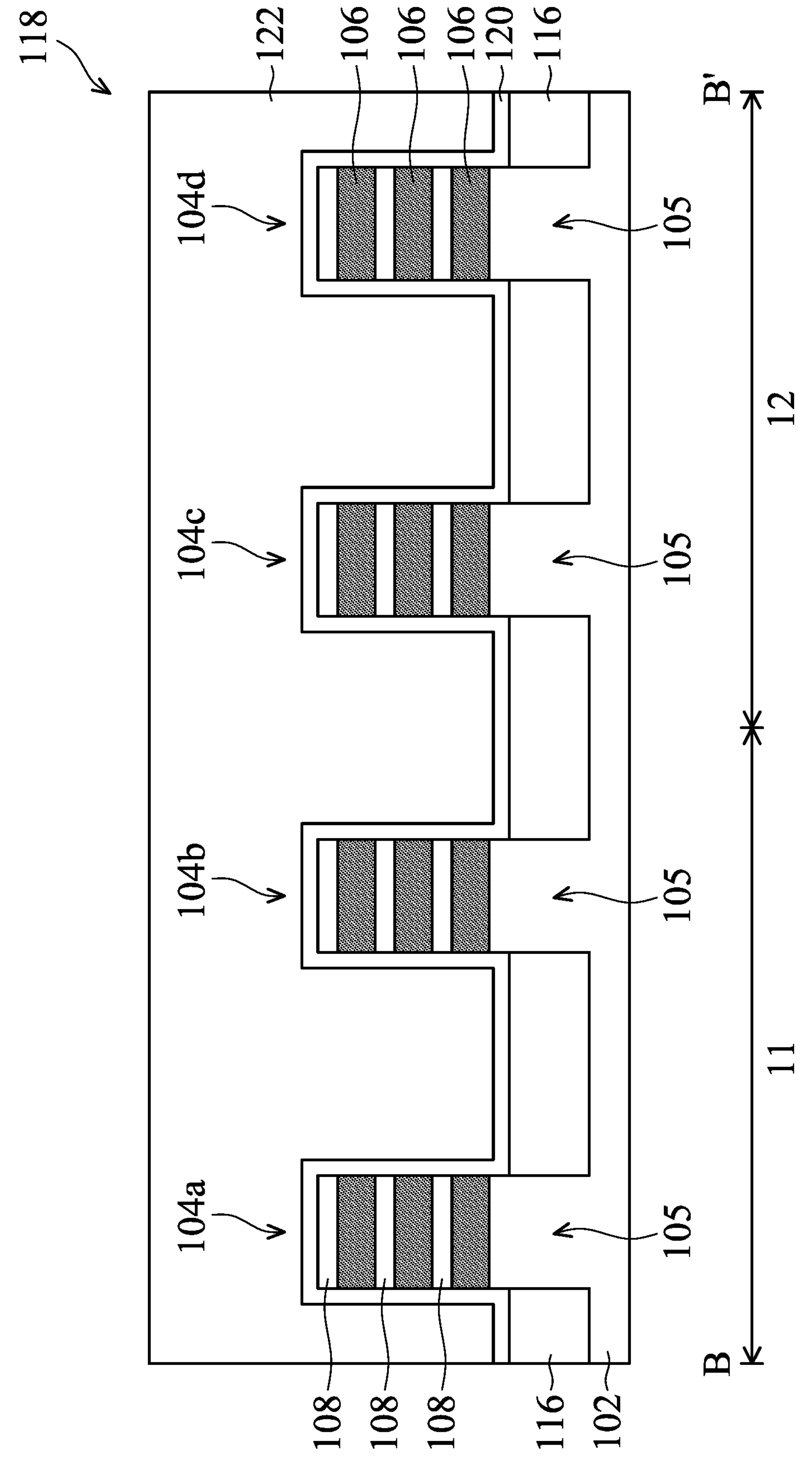
Figures 3, 3C:
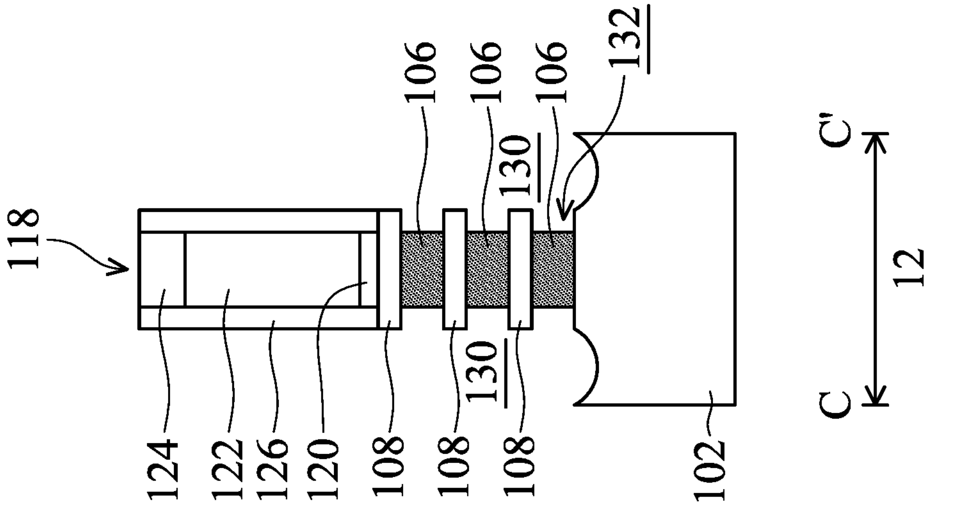
Figures 1, 3D:
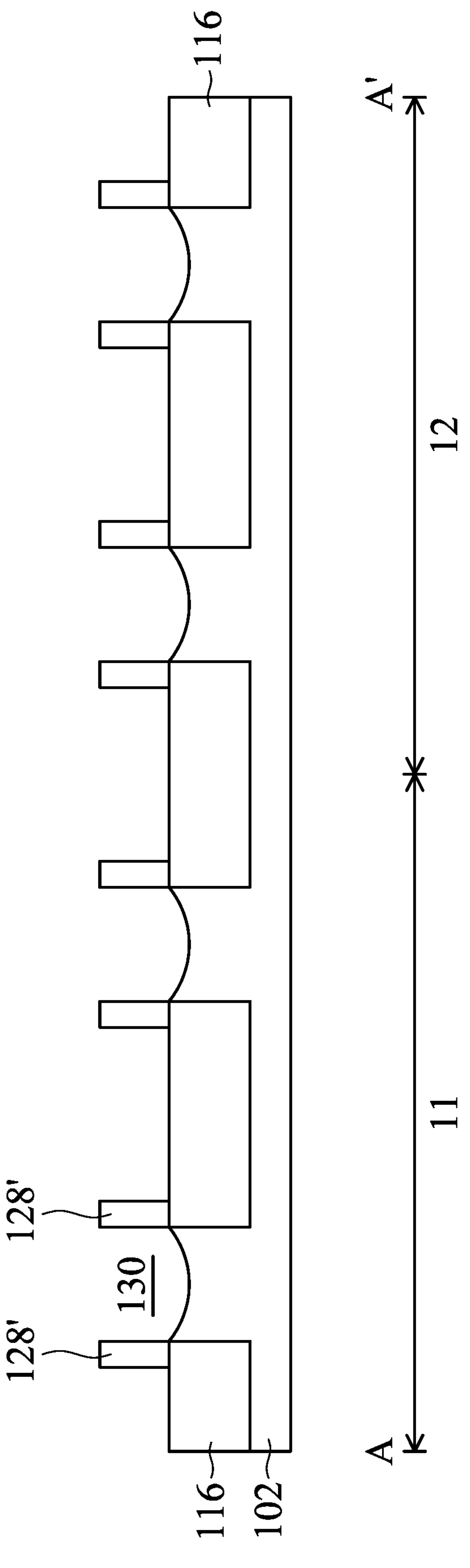
Figures 2, 3D:
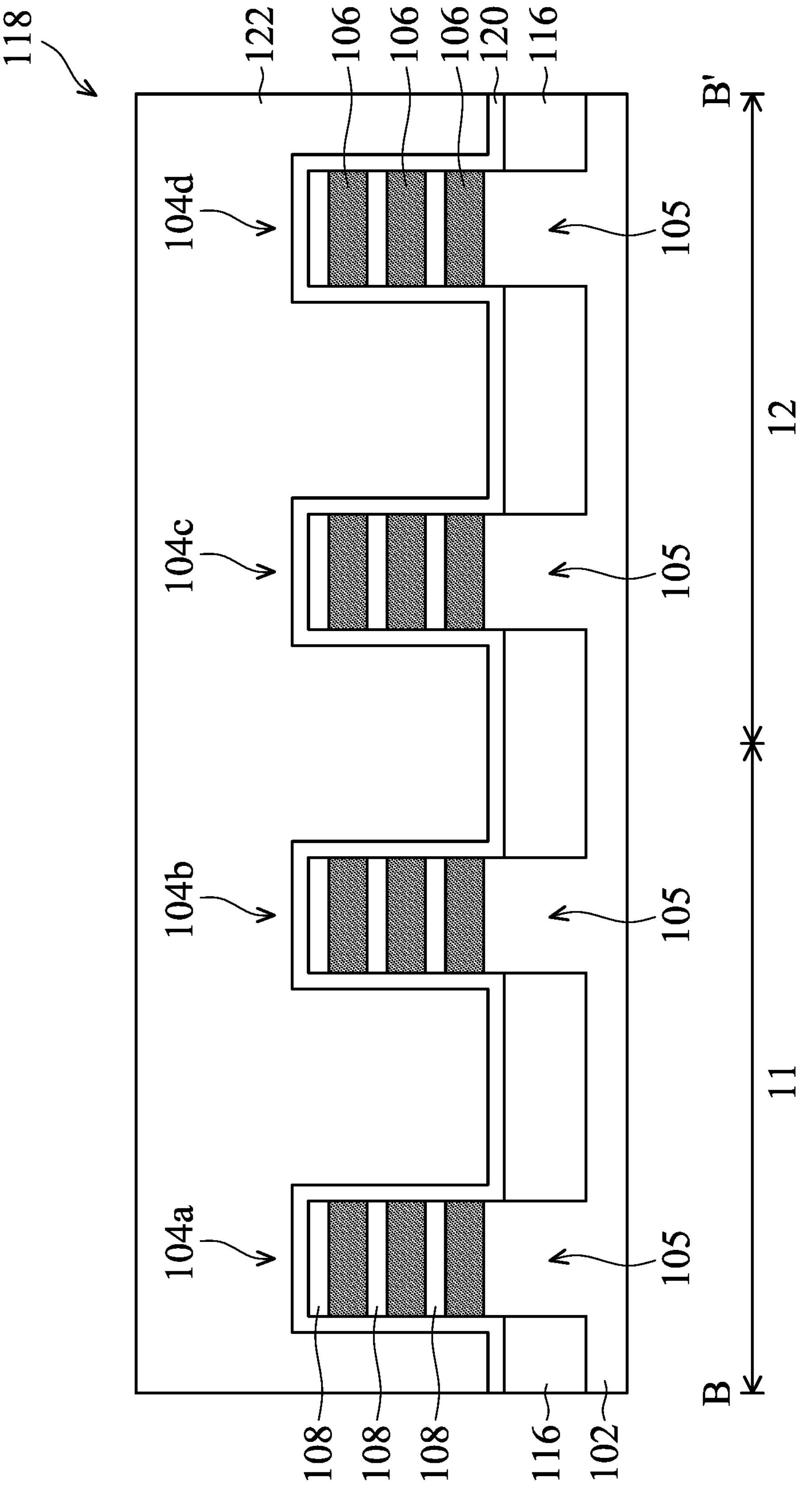
Figures 3, 3D:
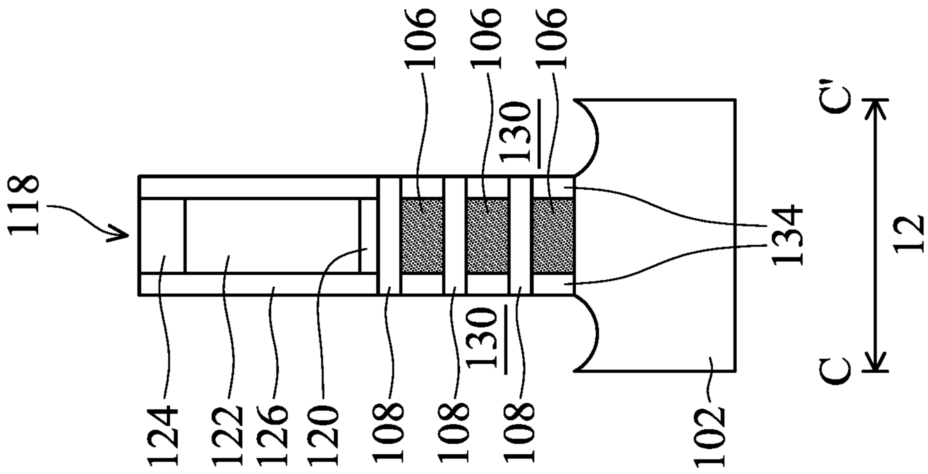
Figures 1, 3E:
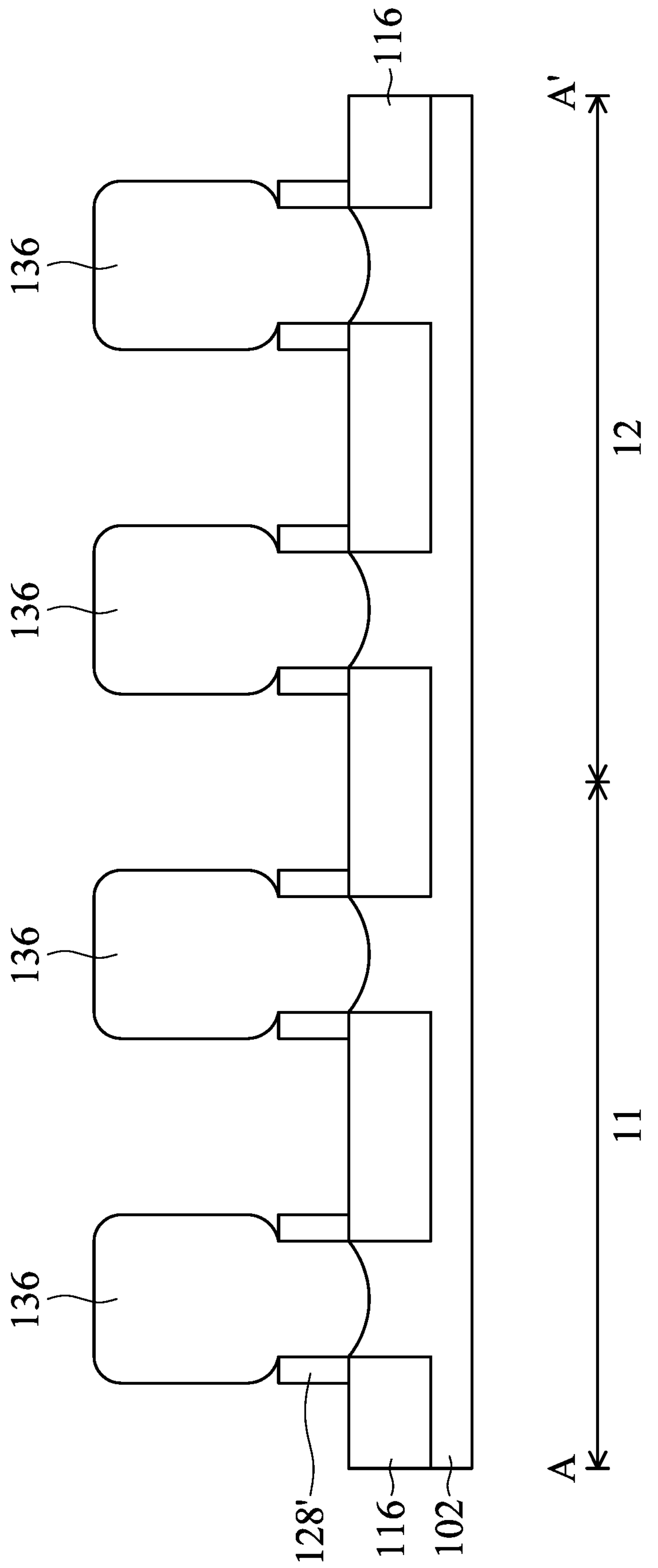
Figures 2, 3E:
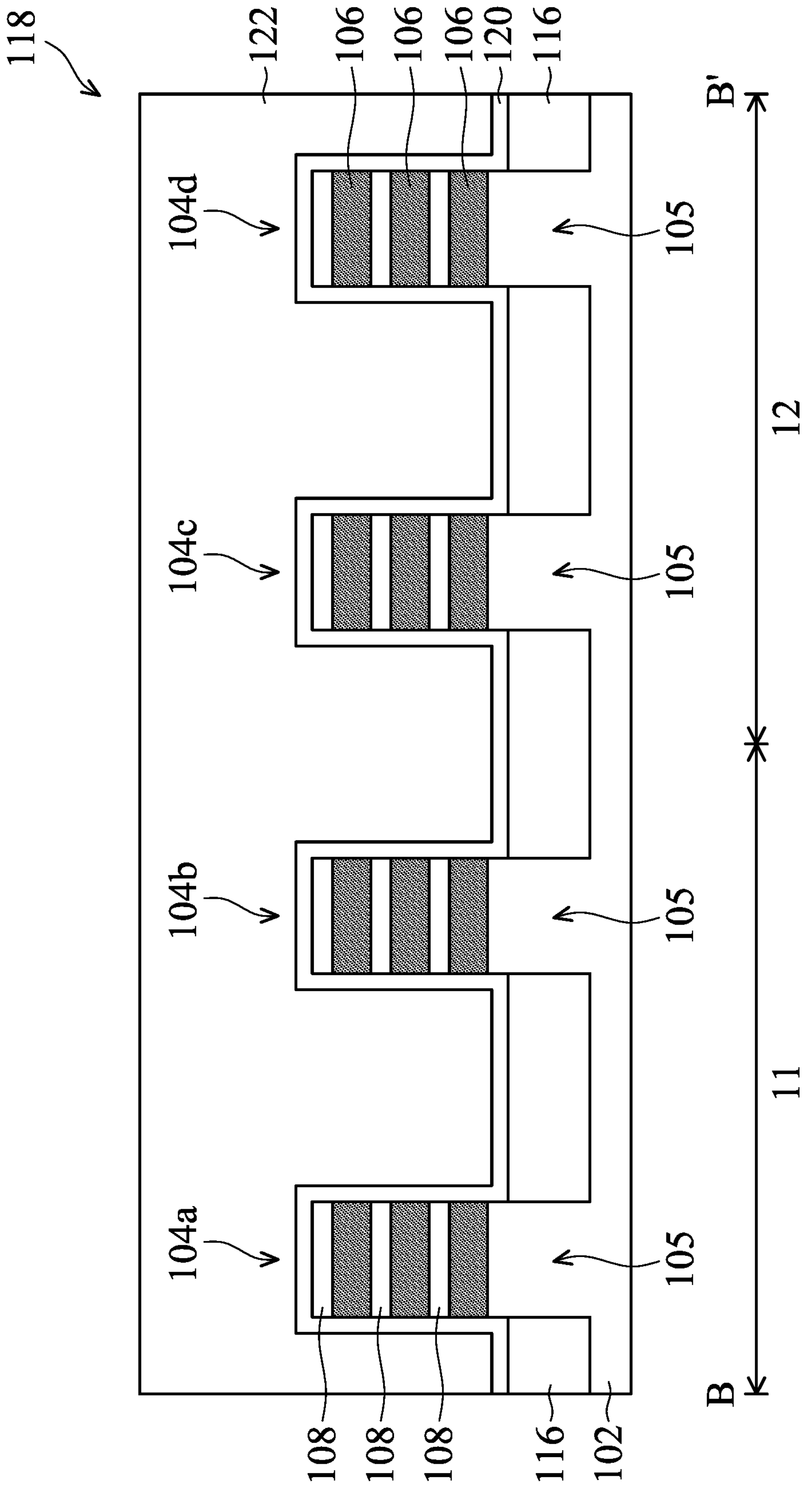
Figures 3, 3E:
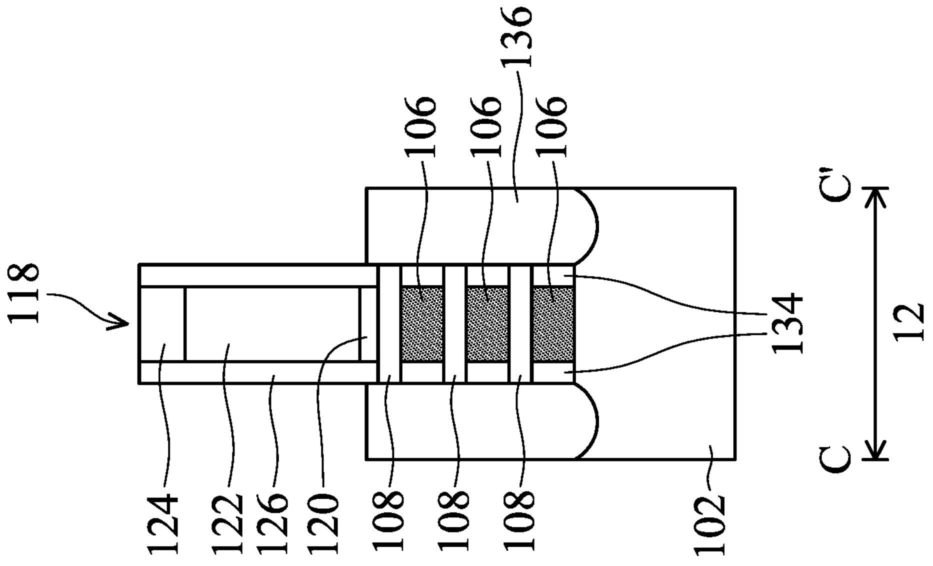
Figures 1, 3F:
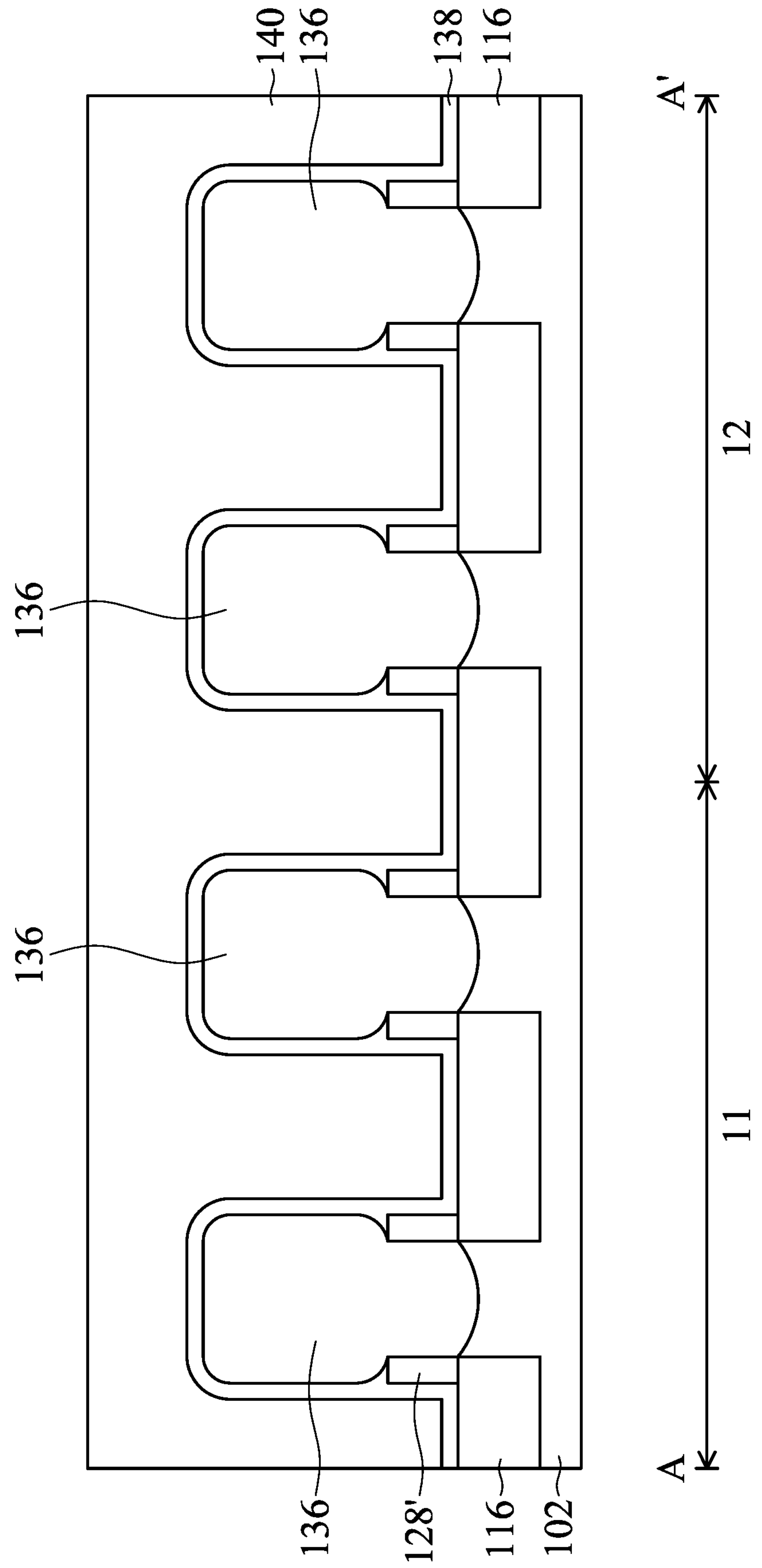
Figures 2, 3F:
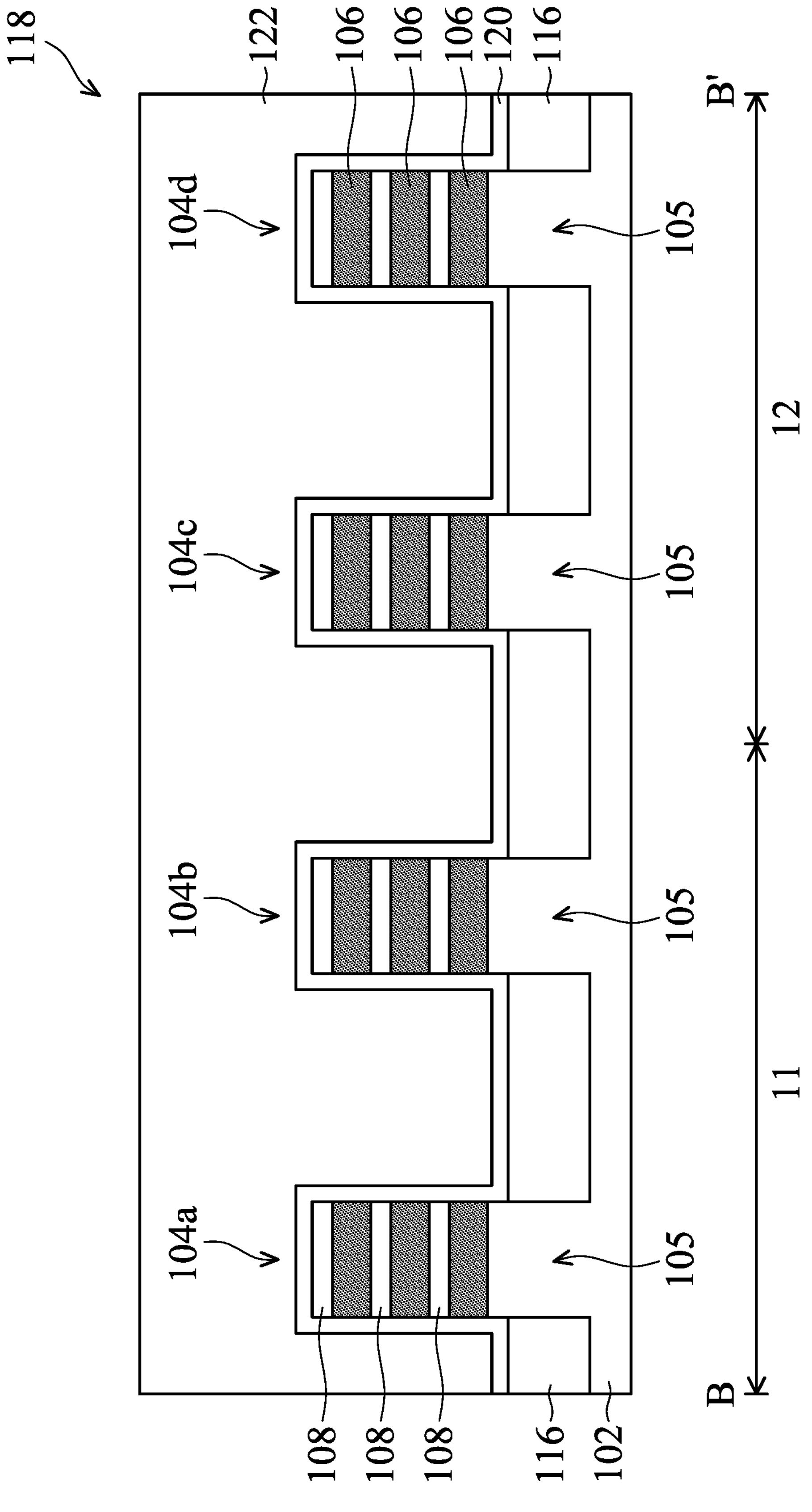
Figures 3, 3F:
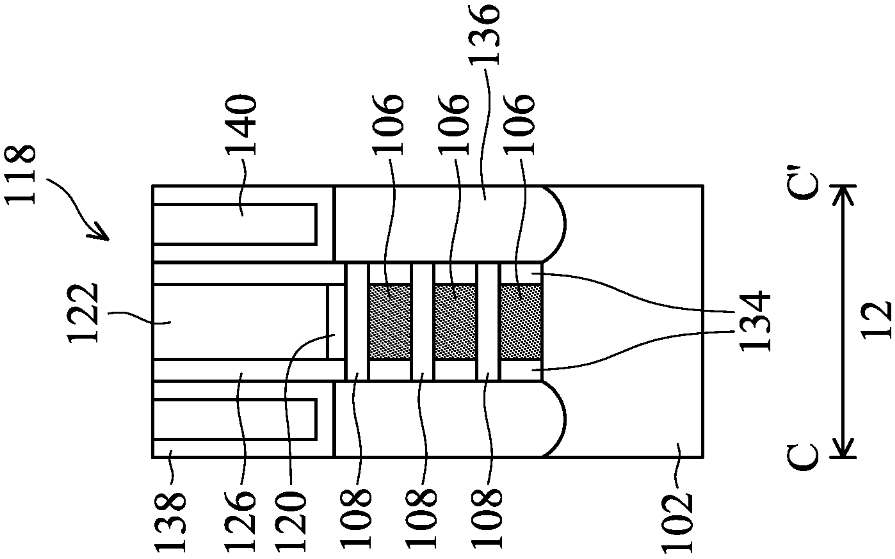
Figures 1, 3G:
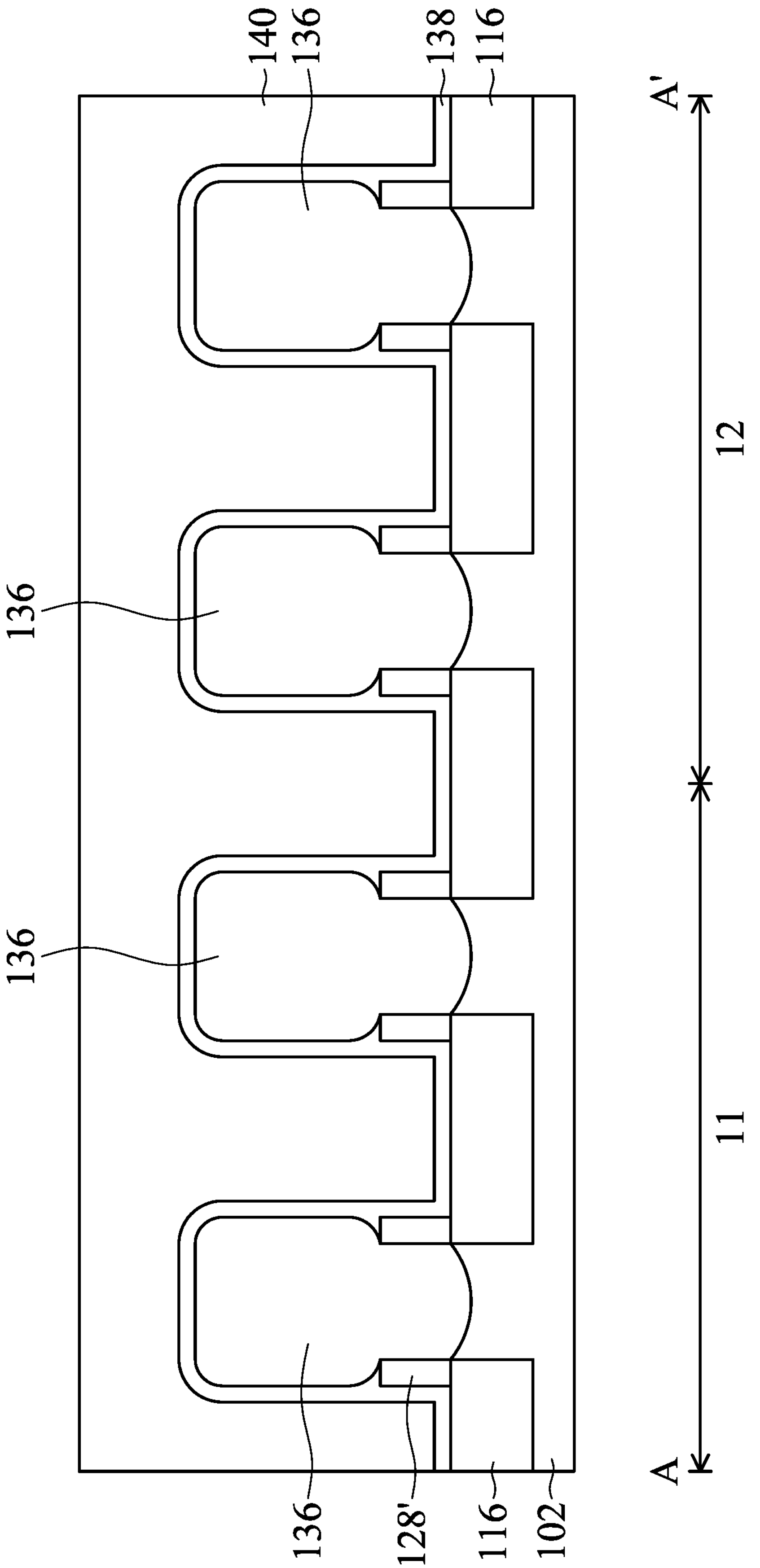
Figures 2, 3G:
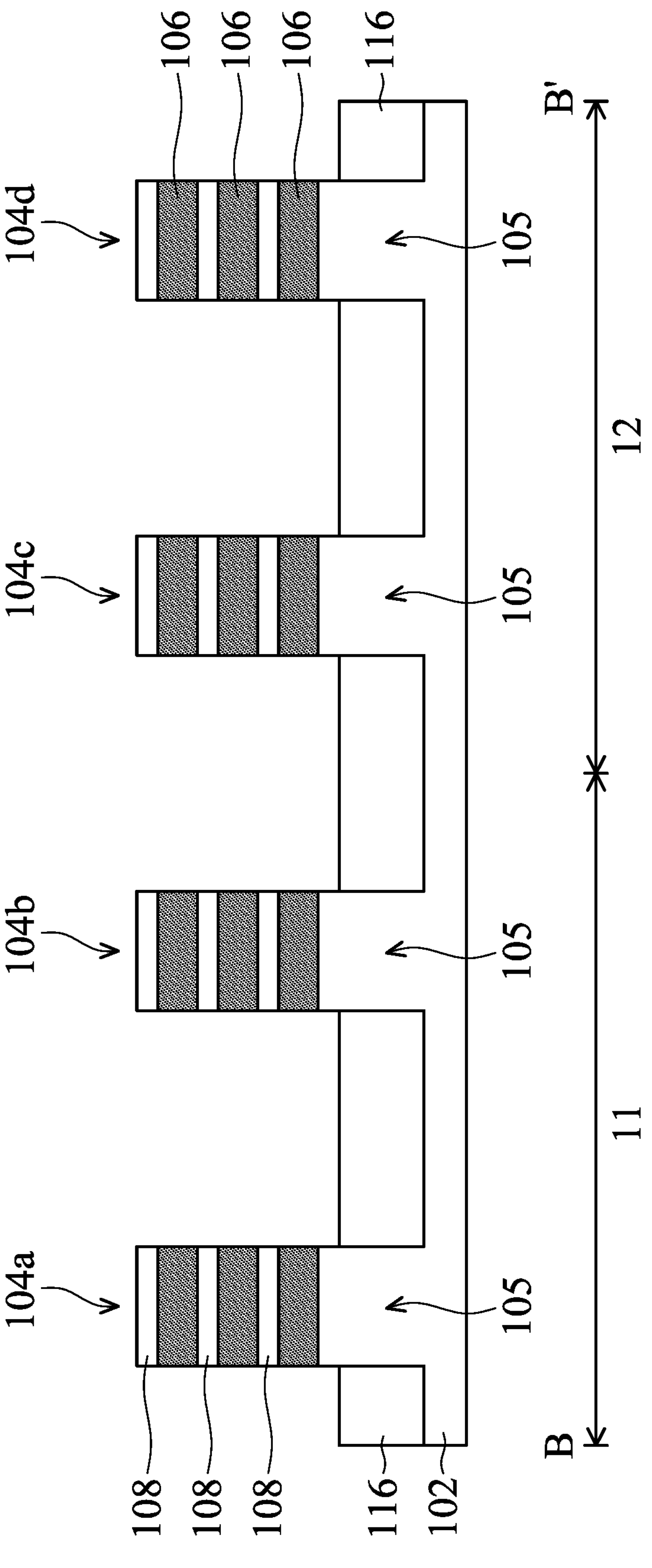
Figures 3, 3G:
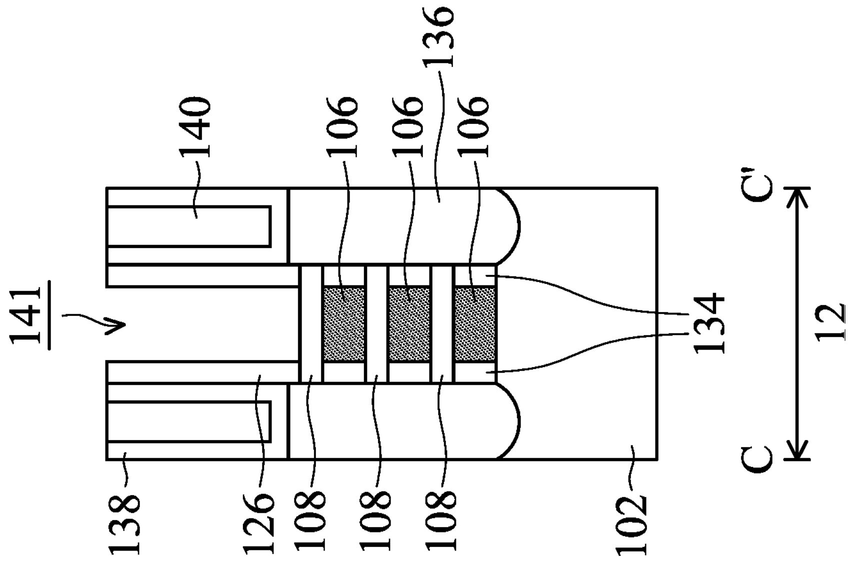
Figures 1, 3H:
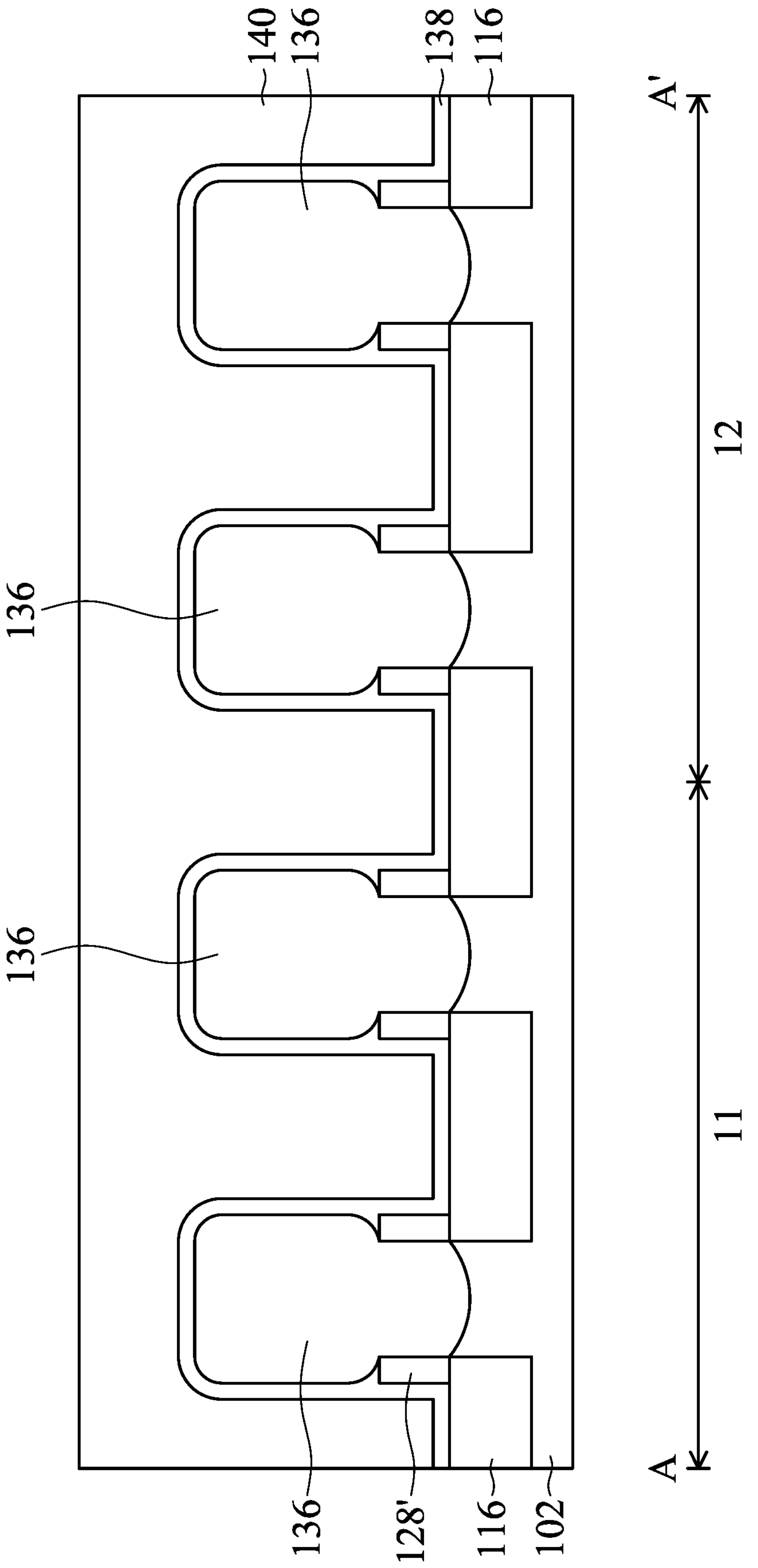
Figures 2, 3H:
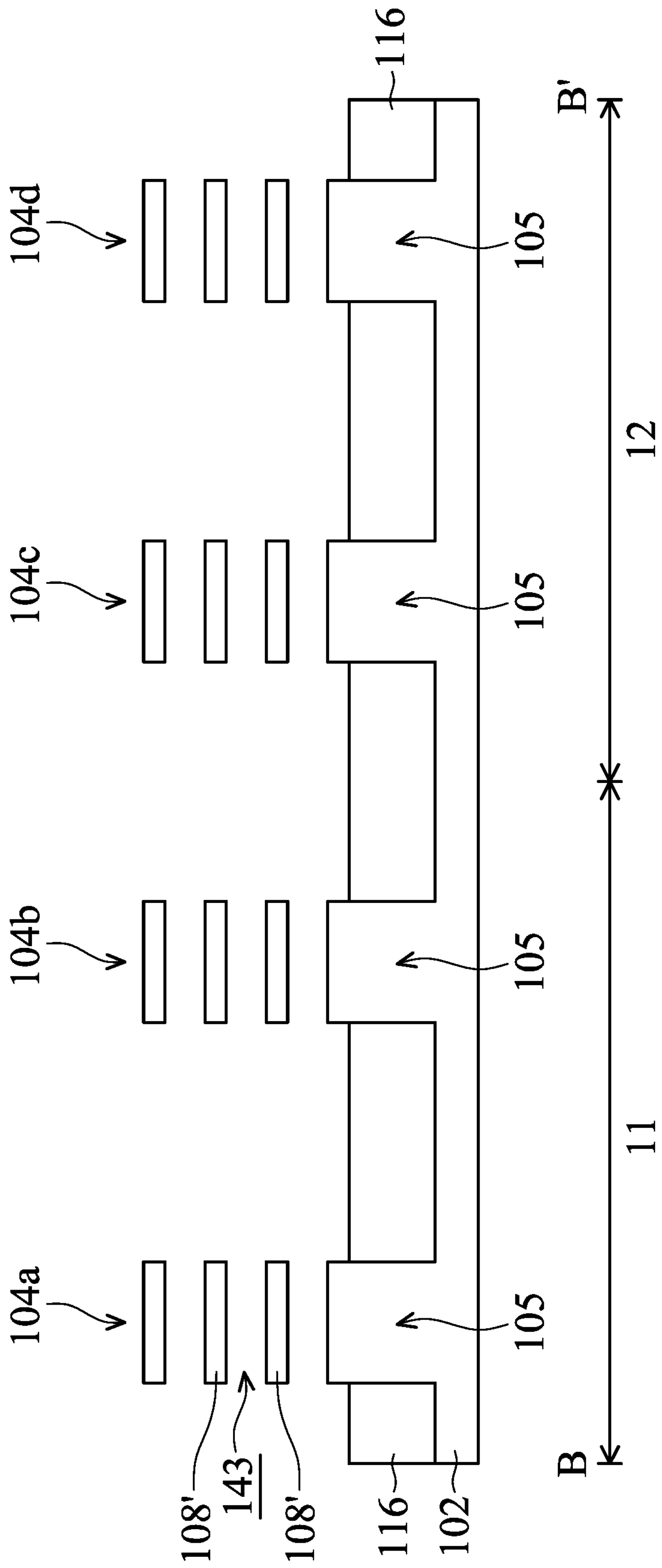
Figures 3, 3H:
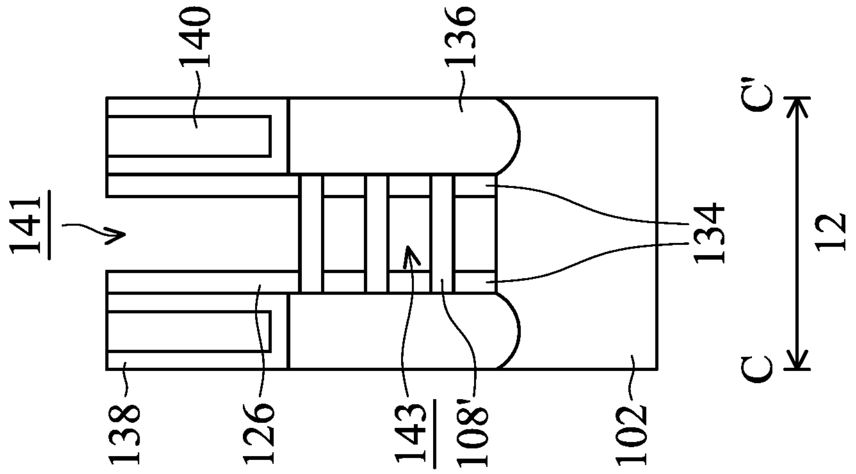
Figures 1, 3I:
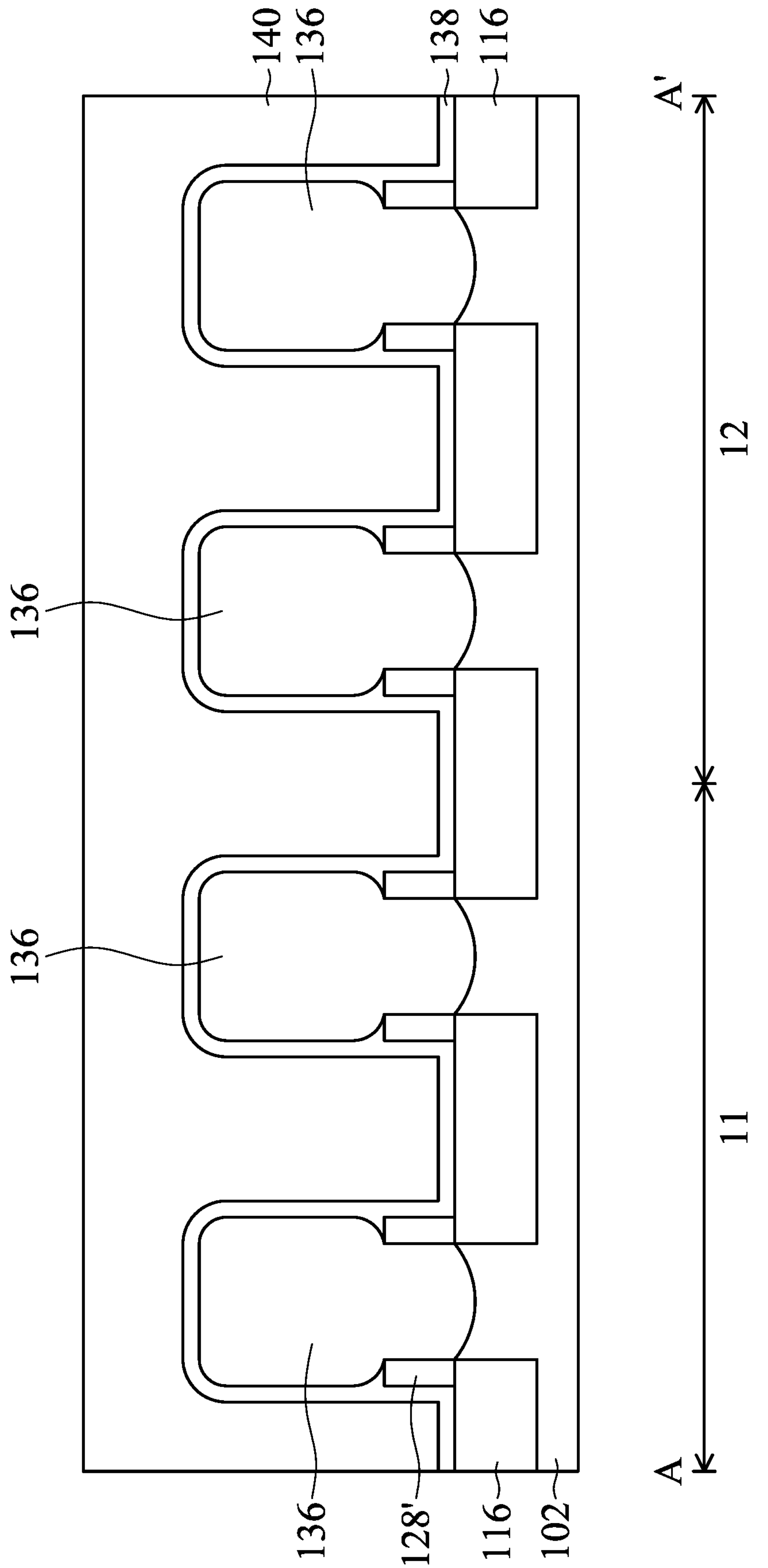
Figures 2, 3I:
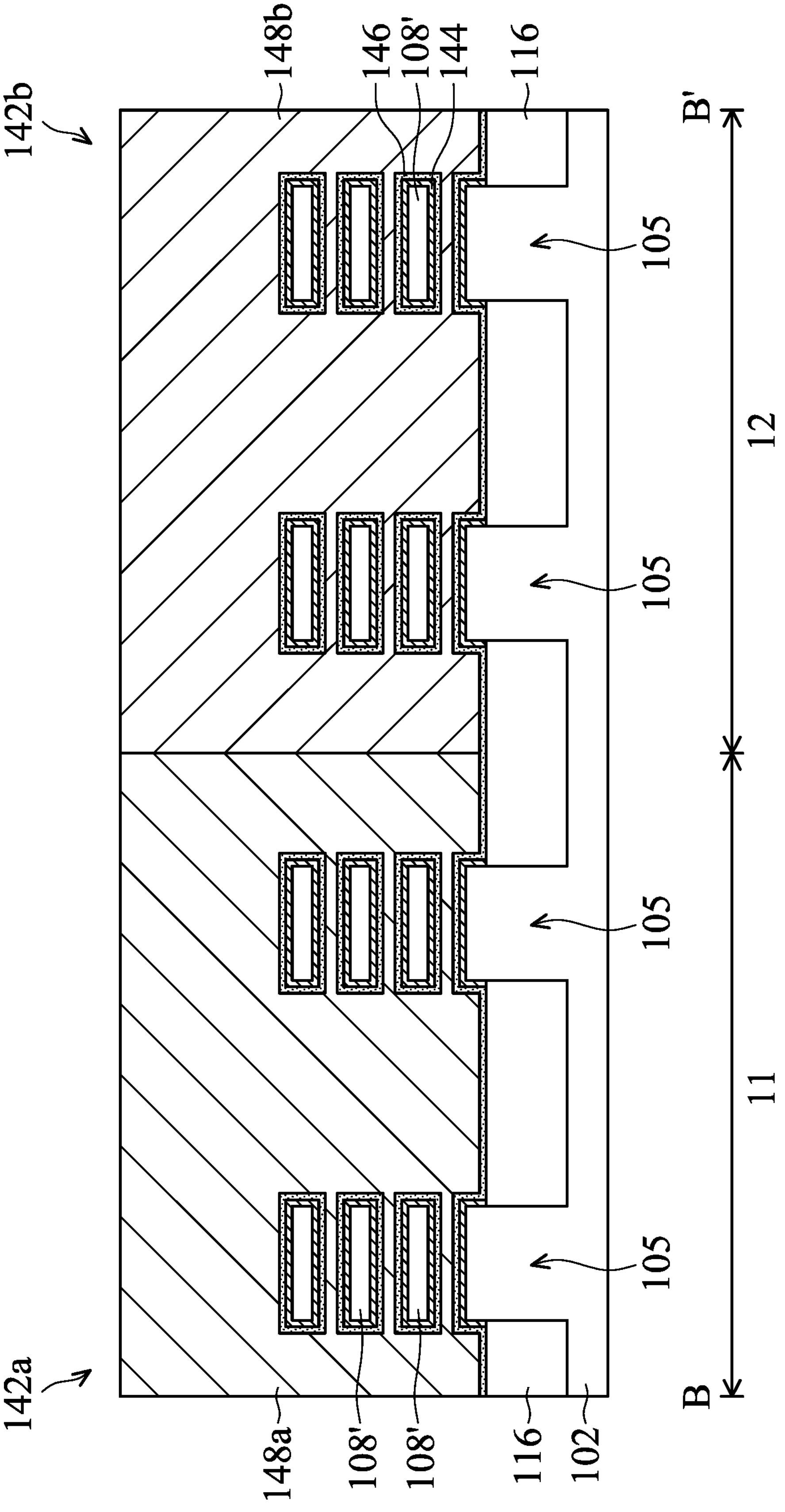
Figures 3, 3I:
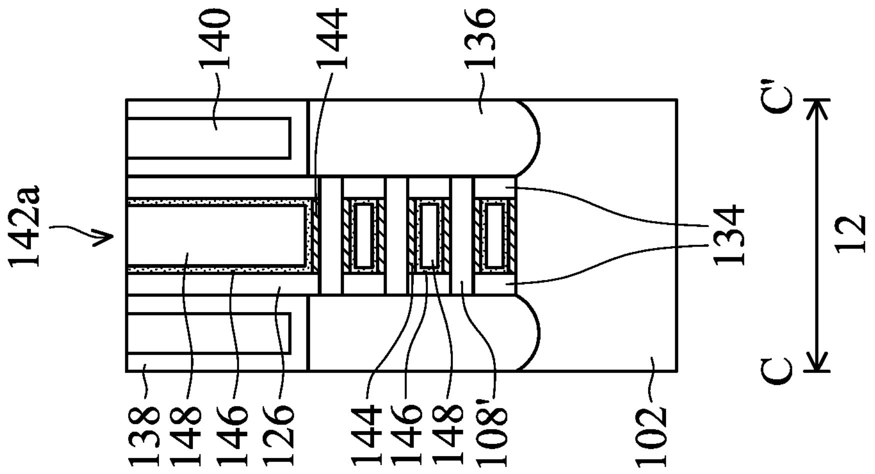
Figures 1, 3J:
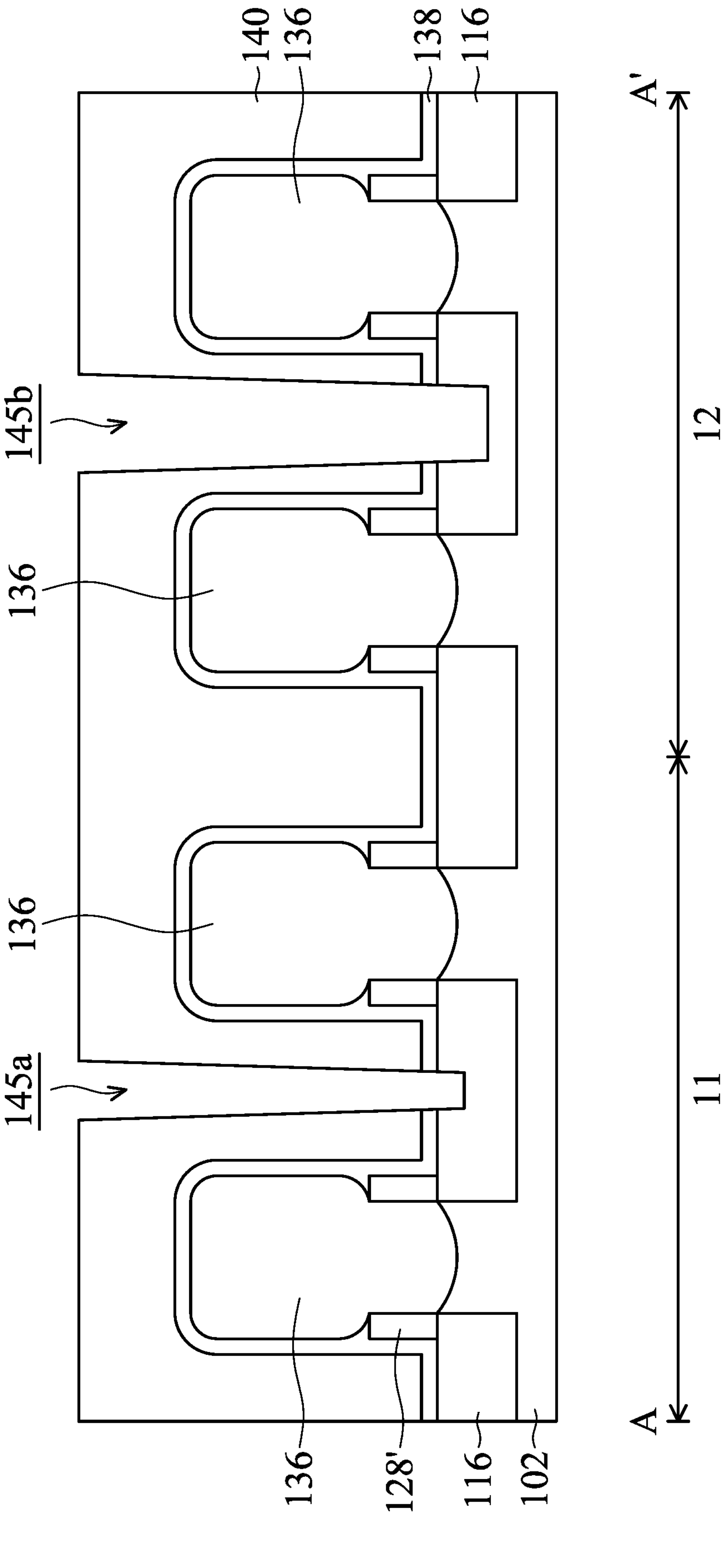
Figures 2, 3J:
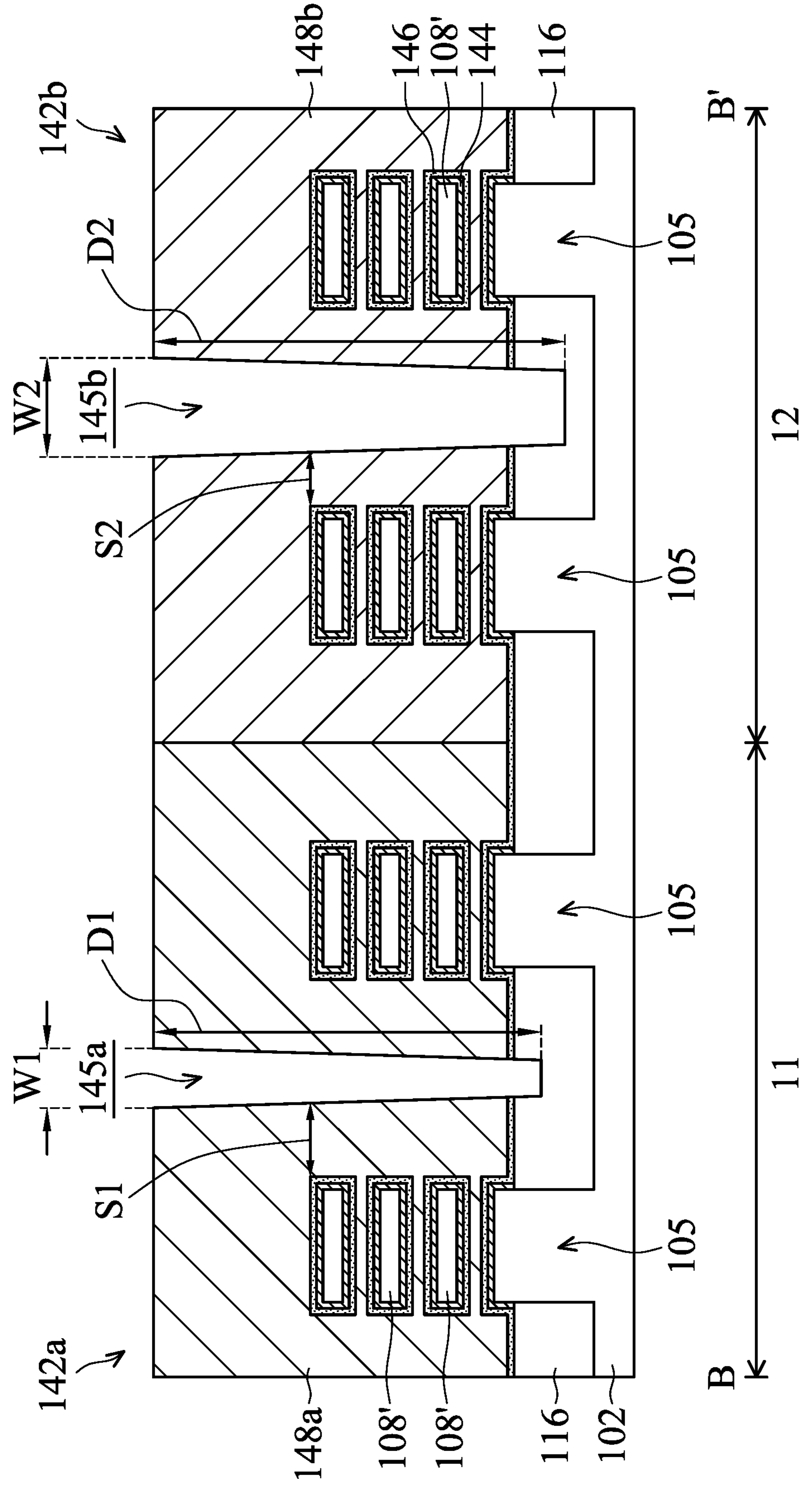
Figures 3, 3J:
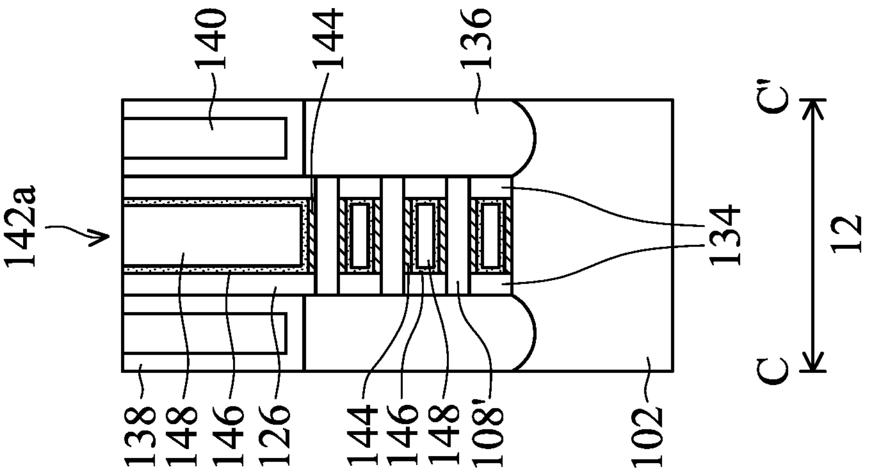
Figures 1, 3K:
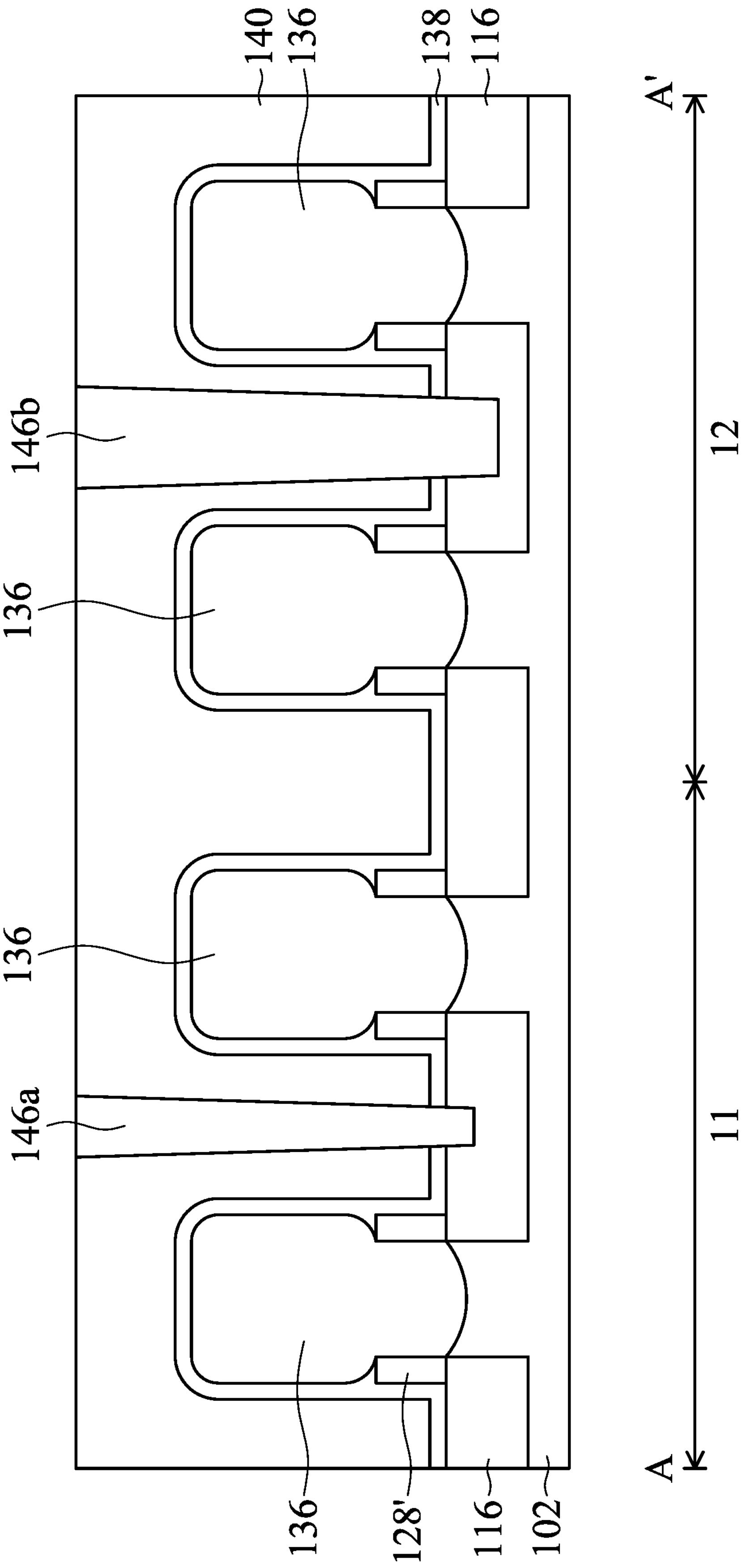
Figures 2, 3K:
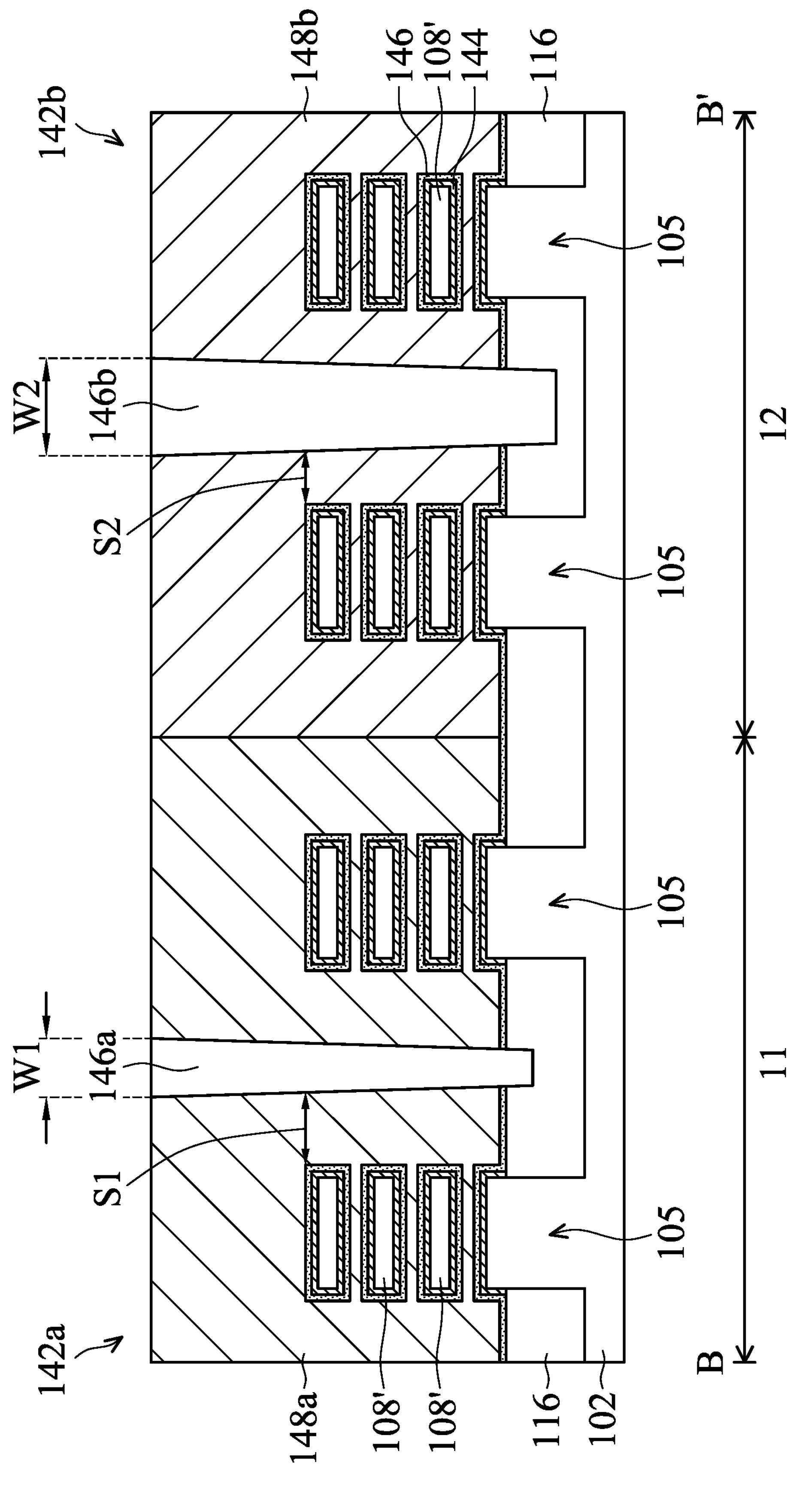
Figures 3, 3K:
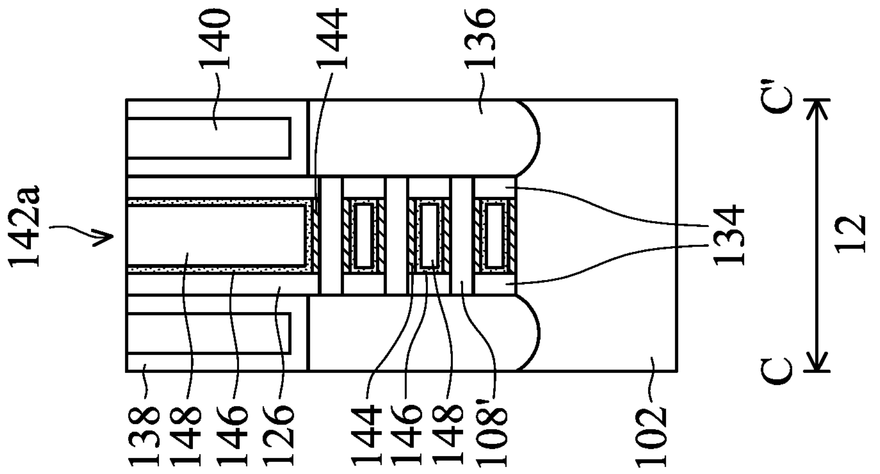
Figures 1, 3L:
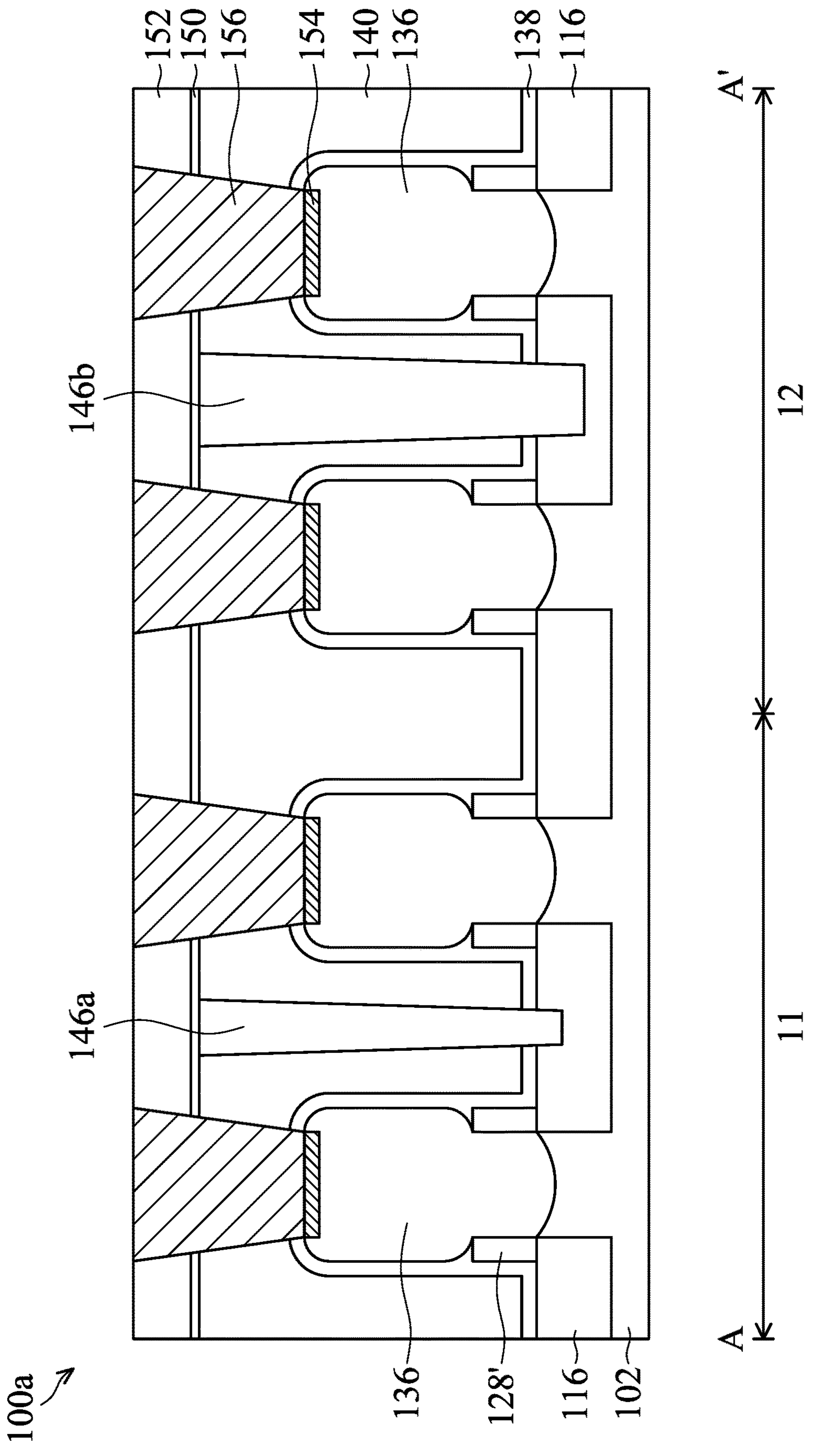
Figures 2, 3L:
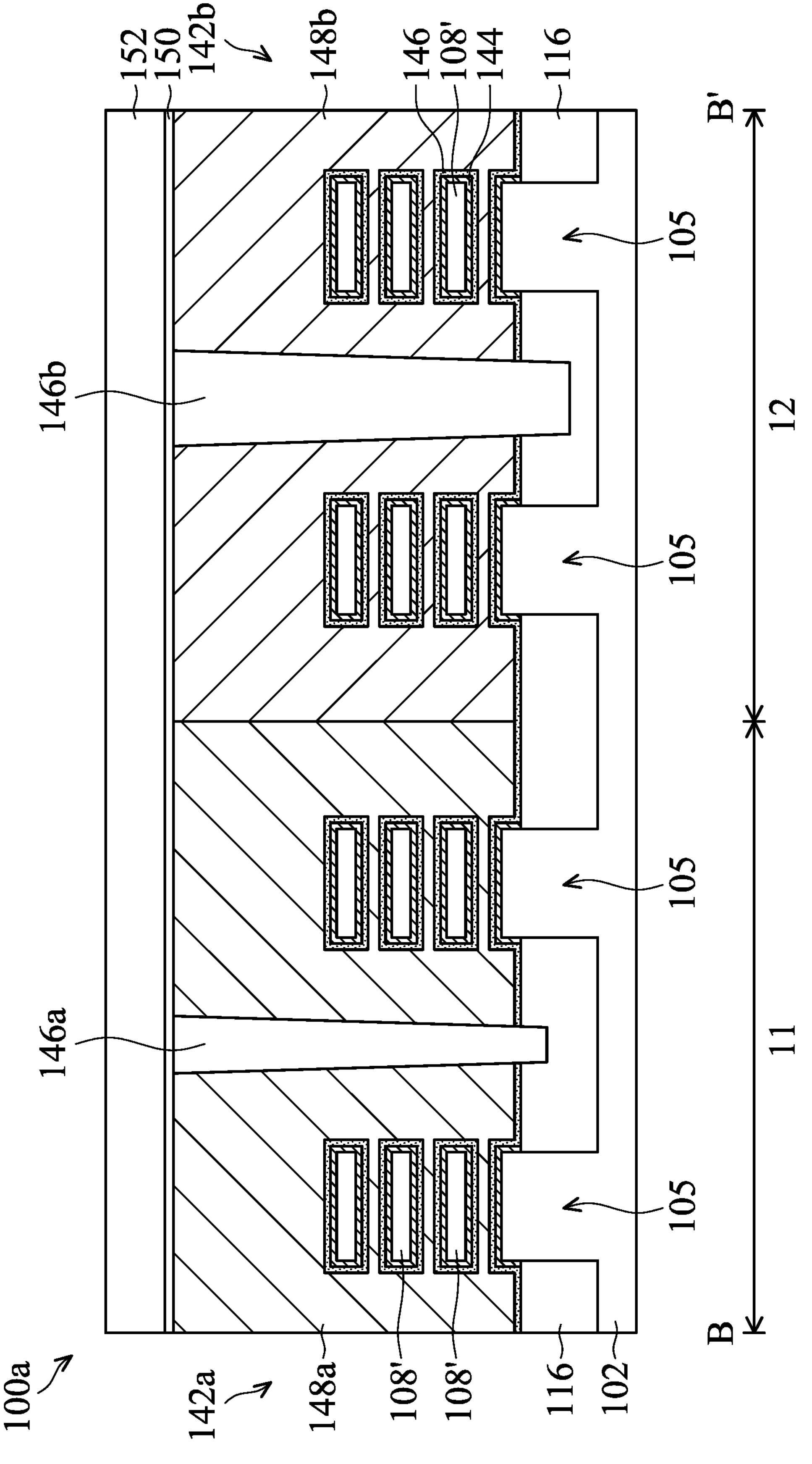
Figures 3, 3L:
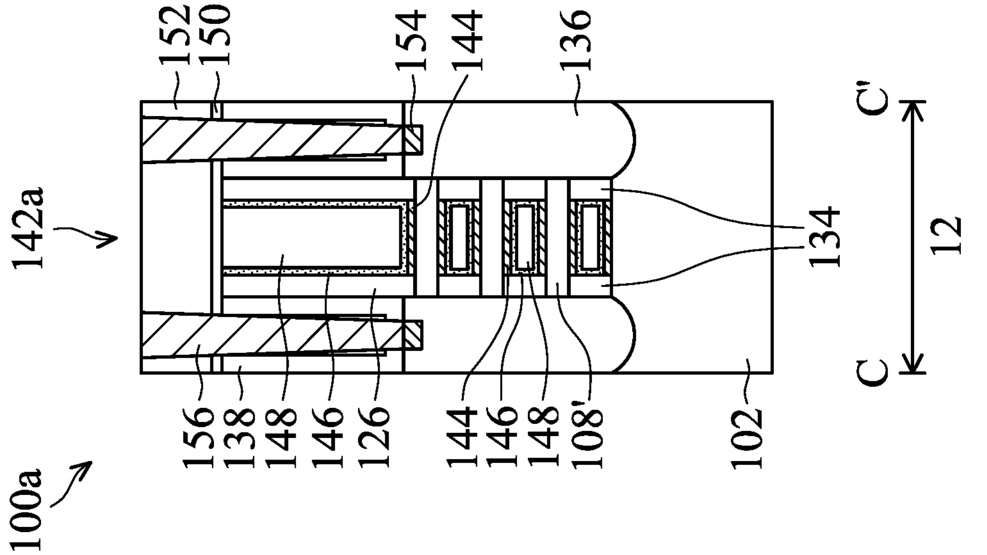

FIGS. 3A-1 to 3L-1 illustrate cross-sectional representations of various stages of manufacturing the semiconductor structure 100*a* shown along line A-A' in FIGS. 1E and 1*n* FIG. 2, in accordance with some embodiments. FIGS. 3A-2 to 3L-2 illustrate cross-sectional representations of various stages of manufacturing the semiconductor structure 100*a* shown along line B-B' in FIGS. 1E and 1*n* FIG. 2, in accordance with some embodiments. FIGS. 3A-3 to 3L-3 illustrate cross-sectional representations of various stages of manufacturing the semiconductor structure 100*a* shown along line C-C' in FIGS. 1E and 1*n* FIG. 2, in accordance with some embodiments.

More specifically, FIG. 3A-1 illustrates the cross-sectional representation shown along line A-A' ‘in FIG. 1E and FIG. 2. FIG. 3A-2 illustrates the cross-sectional representation shown along line B-B’ in FIG. 1E and FIG. 2 in accordance with some embodiments. FIG. 3A-3 illustrates the cross-sectional representation shown along line C-C' in FIGS. 1E and 1*n* FIG. 2.

Next, as shown in FIGS. 3B-1, 3B-2 and 3B-3, after the gate spacer layers 126 and the fin spacer layers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacer layers 126 are removed, in accordance with some embodiments. In addition, some portions of the base fin structure 105 are also recessed to form curved top surfaces, as shown in FIG. 3B-1 in accordance with some embodiments.

In some embodiments, the first fin structure 104*a* and the second fin structure 104*b*, the third fin structure 104*c* and the fourth fin structure 104*d* are recessed by performing an etching process. The etching process may be an anisotropic etching process, such as dry plasma etching, and the dummy gate structures 118, and the gate spacer layers 126 are used as etching masks during the etching process. In some embodiments, the fin spacer layers 128 are also recessed to form lowered fin spacer layers 128'.

Afterwards, as shown in FIGS. 3C-1, 3C-2 and 3C-3, after the source/drain (S/D) recesses 130 are formed, the first semiconductor material layers 106 exposed by the source/drain recesses 130 are laterally recessed to form notches 132, in accordance with some embodiments.

In some embodiments, an etching process is performed on the semiconductor structure 100*a* to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIGS. 3D-1, 3D-2 and 3D-3, inner spacer layers 134 are formed in the notches 132 between the second semiconductor material layers 108, in accordance with some embodiments. The inner spacer layers 134 are configured to separate the source/drain (S/D) structures and the gate structures formed in subsequent manufacturing processes in accordance with some embodiments. In some embodiments, the inner spacer layers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layers 134 are formed by a deposition process, such as chemical vapor deposition (CVD) process, atomic layer deposition (ALD) process, another applicable process, or a combination thereof.

Afterwards, as shown in FIGS. 3E-1, 3E-2 and 3E-3, after the inner spacer layers 134 are formed, the source/drain (S/D) structures 136 are formed, in accordance with some embodiments.

In some embodiments, the source/drain (S/D) structures 136 are made of any applicable material, such as Ge, Si, GaAs, AlGaAs, SiGe, GaAsP, SiP, SiC, SiCP, or a combination thereof. The S/D structures 136 are formed by using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof.

In some embodiments, the source/drain (S/D) structures 136 are in-situ doped during the epitaxial growth process. For example, the source/drain (S/D) structure 136 may be the epitaxially grown SiGe doped with boron (B). For example, the source/drain (S/D) structure 136 may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP) source/drain features. In some embodiments, the source/drain (S/D) structures 136 are doped in one or more implantation processes after the epitaxial growth process.

Next, as shown in FIGS. 3F-1, 3F-2 and 3F-3, after the first source/drain (S/D) structures 136 are formed, a contact etch stop layer (CESL) 138 is conformally formed to cover the S/D structures 136, and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 3F-3 in accordance with some embodiments.

Next, as shown in FIGS. 3G-1, 3G-2 and 3G-3, the dummy gate structures 118 are removed to form a trench 141, in accordance with some embodiments. As a result, the first fin structure **104*a*, the second fin structure 104*b*, the third fin structure 104*c* and the fourth fin structure 104*d* are exposed by the trench 141**.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Afterwards, as shown in FIGS. 3H-1, 3H-2 and 3H-3, the first semiconductor material layers 106 are removed to form trenches 143, in accordance with some embodiments. As a result, the nanostructures 108' (or channel layers 108') with the second semiconductor material layers 108 are obtained. The number of the nanostructures 108' (or channel layers 108') may be adjusted according to actual application.

Afterwards, as shown in FIGS. 3I-1, 3I-2 and 3I-3, after the nanostructures 108' are formed, a first gate structure **142*a* and a second gate structure 142*b* are formed to surround the nanostructures 108' and over the isolation structure 116, in accordance with some embodiments. In some embodiments, the first gate structure 142*a* is an N-type gate structure, and the second gate structure 142*b*** is a P-type gate structure.

In some embodiments, the first gate structure **142*a* includes an N-type gate electrode layer and silicon (Si) layer. The silicon layer is formed after the N-type gate electrode layer is formed. The silicon layer of the first gate structure 142*a* is used to reduce the etching rate of the first gate structure 142*a* when comparing with the etching rate of the second gate structure 142*b*** in the following process.

After the nanostructures 108' are formed, the first gate structure **142*a* and the second gate structure 142*b* are formed to surround the nanostructures 108'. The first gate structure 142*a* and the second gate structure 142*b* wrap around the nanostructures 108' to form gate-all-around transistor structures in accordance with some embodiments. In some embodiments, the first gate structure 142*a* includes an interfacial layer 144, a gate dielectric layer 146, and a first gate electrode layer 148*a*. In some embodiments, the second gate structure 142*b* includes an interfacial layer 144, a gate dielectric layer 146, and a second gate electrode layer 148*b***.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the first gate electrode layer 148*a* and the second gate electrode layer 148*b* are formed on the gate dielectric layer 146. In some embodiments, the second gate electrode layer 148*b* is formed firstly, and the first gate electrode layer 148*a* is formed after the second gate electrode layer 148*b*. In some other embodiments, first gate electrode layer 148*a* is formed firstly, and the second gate electrode layer 148*b* is formed later.

In some embodiments, the first gate electrode layer 148*a* and the second gate electrode layer 148*b* are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the first gate electrode layer 148*a* and the second gate electrode layer 148*b* are formed by using chemical vapor deposition (CVD), atomic layer deposition (ALD), electroplating, another applicable method, or a combination thereof. Other conductive layers, such as work function metal layers, may also be formed in first gate electrode layer 148*a* and the second gate electrode layer 148*b*, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, the first gate electrode layer 148*a* and the second gate electrode layer 148*b* are formed, a planarization process such as CMP or an etch-back process may be performed until the ILD layer 140 is exposed.

Afterwards, as shown in FIGS. 3J-1, 3J-2 and 3J-3, a portion of the first gate structure 142*a* is removed to form a first trench 145*a*, and a portion of the second gate structure 142*b* is removed to form a second trench 145*b*, in accordance with some embodiments.

It should be noted that the first gate electrode layer 148*a* of the first gate structure 142*a* includes silicon layer, and the etching rate (or removal rate) of first gate electrode layer 148*a* of the first gate structure 142*a* is smaller than the etching rate (or removal rate) of the second gate electrode layer 148*b* of the second gate structure 142*b*. The first depth D1 of the first trench 145*a* is smaller than the second depth D2 of the second trench 145*b*. In addition, the first width W1 of the first trench 145*a* is smaller than the second width W2 of the second trench 145*b*. The bottom surface of the first trench 145*a* is higher than the bottom surface of the second trench 145*b*. In some embodiments, the bottom surface of the first trench 145*a* is lower than the top surface of the isolation structure 116. In some embodiments, the bottom surface of the second trench 145*b* is lower than the top surface of the isolation structure 116.

Furthermore, there is the first distance S1 between the sidewall surface of the topmost nanostructure 108' and the sidewall surface of the first trench 145*a* along the second direction. There is the second distance S2 between the sidewall surface of the topmost nanostructure 108' and the sidewall surface of the second trench 145*b* along the second direction. In some embodiments, the first distance S1 is greater than the second distance S2. In some embodiments, the difference between the first distance S1 and the second distance S2 is in a range from about 1 nm to about 4 nm.

Next, as shown in FIGS. 3K-1, 3K-2 and 3K-3, an isolation material is filled into the first trench 145*a* and the second trench 145*b* to form a first isolation wall structure 146*a* and a second isolation wall structure 146*b*, in accordance with some embodiments. Next, the excess of the isolation material is removed by the planarization process such as CMP or an etch-back process. The first gate structure 142*a* is cut by the first isolation wall structure 146*a* into two segments that are electrically isolated from one another. The second gate structure 142*b* is cut by the second isolation wall structure 146*b* into two segments that are electrically isolated from one another. The first isolation wall structure 146*a* and the second isolation wall structure 146*b* may be also referred to as cut metal gate (CMG) pattern.

In some embodiments, the first isolation wall structure 146*a* has multiple layers. In some embodiments, the second isolation wall structure 146*b* has multiple layers. In some embodiments, the first isolation wall structure 146*a* and the second isolation wall structure 146*b* are made of dielectric materials, such as silicon oxide ($SiO_2$), fluorine (F)-doped silicon oxide ($SiO_2$), silicon oxycarbide (SiOC), silicon nitride (SiN), silicon oxycarbonitride (SiOCN), silicon oxynitride (SiON), silicon carbon nitride (SiCN), oxygen-doped silicon carbonitride (Si(O)CN), low-k dielectric material or a combination thereof. In some embodiments, the first isolation wall structure 146*a* includes silicon nitride (SiN) and silicon oxide ($SiO_2$) formed after the silicon nitride (SiN). In some embodiments, the first isolation wall structure 146*a* and the second isolation wall structure 146*b* are formed by using chemical vapor deposition (CVD), atomic layer deposition (ALD), or another applicable process.

The first width W1 of the first isolation wall structure 146*a* is smaller than the second width W2 of the second isolation wall structure 146*b*. In other words, the second width W2 of the second isolation wall structure 146*b* is greater than the first width W1 of the first isolation wall structure 146*a*. In addition, the bottom surface of the first isolation wall structure 146*a* is higher than the bottom surface of the second isolation wall structure 146*b*.

Furthermore, there is the first distance $S_1$ between the sidewall surface of the topmost nanostructure 108' and the sidewall surface of the first isolation wall structure 146*a* along the second direction. There is the second distance S2 between the sidewall surface of the topmost nanostructure 108' and the sidewall surface of the second isolation wall structure 146*b* along the second direction, and the first distance S1 is greater than the second distance S2. In some embodiments, the difference between the first distance S1 and the second distance S2 is in a range from about 1 nm to about 4 nm.

Next, as shown in FIGS. 3L-1, 3L-2 and 3L-3, an etch stop layer 150 is formed over the gate structure 142, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, a silicide layer 154 and an S/D contact structure 156 are formed over the S/D structures 136, in accordance with some embodiments.

In some embodiments, the contact openings may be formed through the contact etch stop layer 138, the interlayer dielectric layer 140, the etch stop layer 150 and the dielectric layer 152 to expose the top surfaces of the S/D structures 136, and then the silicide layers 154 and the S/D contact structure 156 may be formed in the contact openings. The contact openings may be formed using a photolithography process and an etching process. In addition, some portions of the S/D structures 136 exposed by the contact openings may also be etched during the etching process.

The silicide layers 154 may be formed by forming a metal layer over the top surfaces of the S/D structures 136 and annealing the metal layer so the metal layer reacts with the S/D structures 136 to form the silicide layers 154. The unreacted metal layer may be removed after the silicide layers 154 are formed.

The S/D contact structures 156 may include a barrier layer and a conductive layer. In some other embodiments, the S/D contact structures 156 do not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

It should be understood that the semiconductor structure 100*a* may undergo further CMOS processes to form various features over the semiconductor structure, such as a multilayer interconnect structure (e.g., contact plugs, conductive vias, metal lines, inter metal dielectric layers, passivation layers, etc.).

As shown in FIG. 3L-2, the first width W1 of the first isolation wall structure 146*a* is smaller than the second width W2 of the second isolation wall structure 146*b*. Therefore, asymmetric layout of the first isolation wall structure 146*a* and the second isolation wall structure 146*b* is obtained.

Since the first distance S1 is greater than the second distance S2, the risk of damage to the first gate structure 142*a* in the etching process for forming the first isolation wall structure 146*a* may reduce, while the parasitic capacitance may reduce. In addition, the speed of the semiconductor device 100*a* is increased. Therefore, the performance and the manufacturing yield of the semiconductor device 100*a* are improved.

Figure 4:
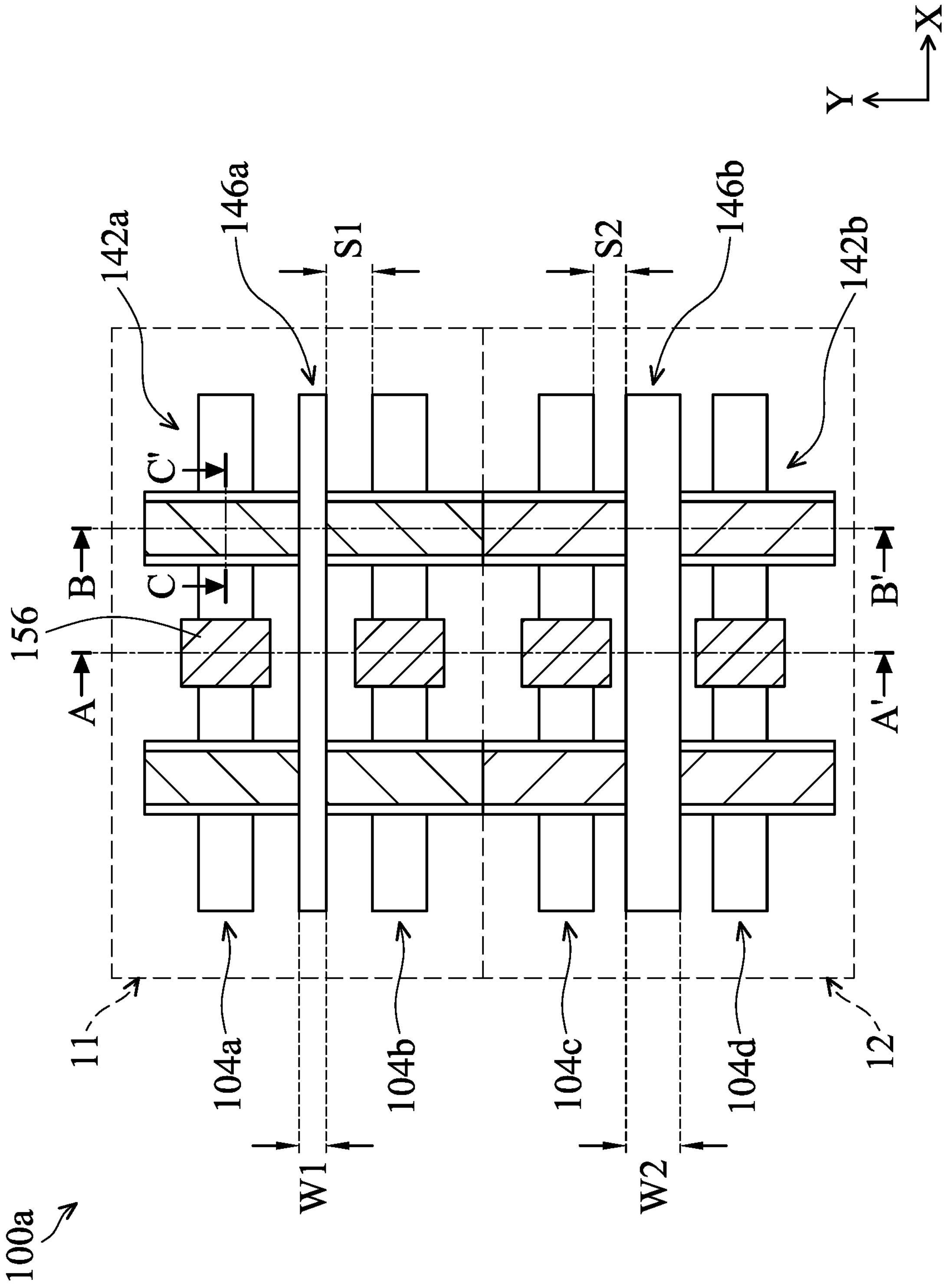
FIG. 4 shows a top-view representation of the semiconductor structure after forming the S/D contact structure, in accordance with some embodiments.

FIG. 4 shows a top-view representation of the semiconductor structure 100*a* after forming the S/D contact structure 156, in accordance with some embodiments. Some features are not shown for clarity.

The first isolation wall structure 146*a* in the first region 11 is formed parallel to the nanostructures 108' of the first fin structure 104*a* and the nanostructures 108' of the second fin structure 104*b* along the first direction (e.g. the X-axis). The second isolation wall structure 146*b* in the second region 12 is formed parallel to the third nanostructures 104*c* and the fourth nanostructures 104*d* along the first direction (e.g. the X-axis). The first isolation wall structure 146*a* is between the nanostructures 108' of the first fin structure 104*a* and the nanostructures 108' of the second fin structure 104*b*. The first gate structure 142*a* is divided into two portions by the first isolation wall structure 146*a*. The second gate structure 142*b* is divided into two portions by the second isolation wall structure 146*b*. The first width $W_1$ of the first isolation wall structure 146*a* is smaller than the second width $W_2$ of the second isolation wall structure 146*b*.

In the first region 11, the first distance S1 is between the sidewall surface of the topmost nanostructure 108' and the sidewall surface of the first isolation wall structure 146*a* along the second direction. In the second region 12, the second distance S2 is between the sidewall surface of the topmost nanostructure 108' and the sidewall surface of the second isolation wall structure 146*b* along the second direction. In some embodiments, the first distance S1 is greater than the second distance S2.

Since the first distance S1 is greater than the second distance S2, the risk of damage to the first gate structure 142*a* in the etching process for forming the first isolation wall structure 146*a* may reduce, while the parasitic capacitance may reduce. In addition, the speed of the semiconductor device 100*a* is increased. Therefore, the performance and the manufacturing yield of the semiconductor device 100*a* are improved.

Figure 5:
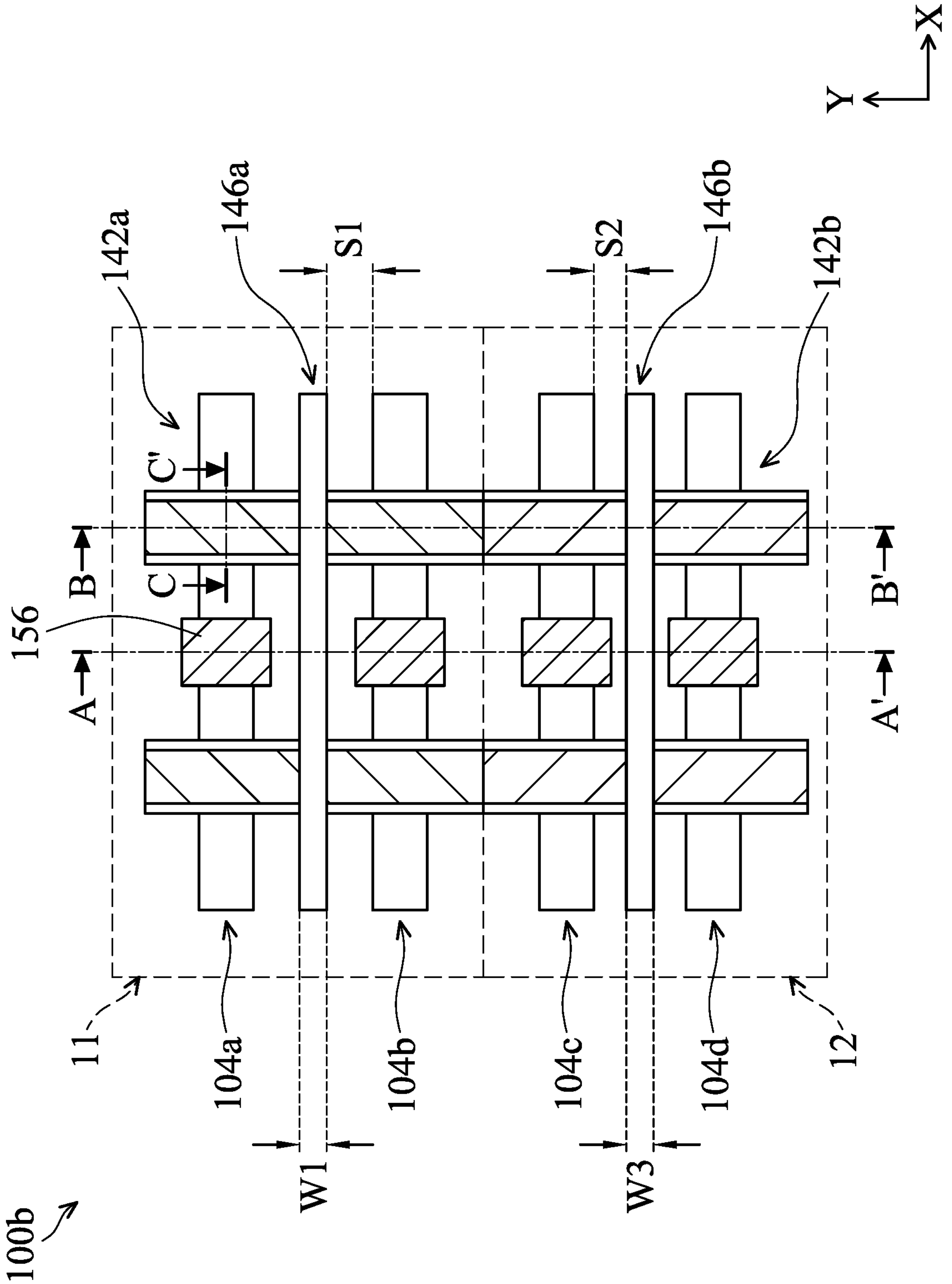
FIG. 5 shows a top-view representation of a semiconductor structure after forming the S/D contact structure, in accordance with some embodiments.

FIG. 5 shows a top-view representation of a semiconductor structure 100*b* after forming the S/D contact structure 156, in accordance with some embodiments. Some features are not shown for clarity. The semiconductor structure 100*b* of FIG. 5 includes elements that are similar to, or the same as, elements of the semiconductor structure 100*a* of FIG. 4, the difference between the FIG. 5 and FIG. 4 is the first width W1 of the first isolation wall structure 146*a* is substantially equal to the third width W3 of the second isolation wall structure 146*b*. Although the width is changed, the first distance S1 is still greater than the second distance S2. The asymmetric layout of the first isolation wall structure 146*a* and the second isolation wall structure 146*b* is obtained.

Since the first distance S1 is greater than the second distance S2, the risk of damage to the first gate structure 142*a* in the etching process for forming the first isolation wall structure 146*a* may reduce, while the parasitic capacitance may reduce. In addition, the speed of the semiconductor device 100*b* is increased. Therefore, the performance and the manufacturing yield of the semiconductor device 100*b* are improved.

Figure 6:
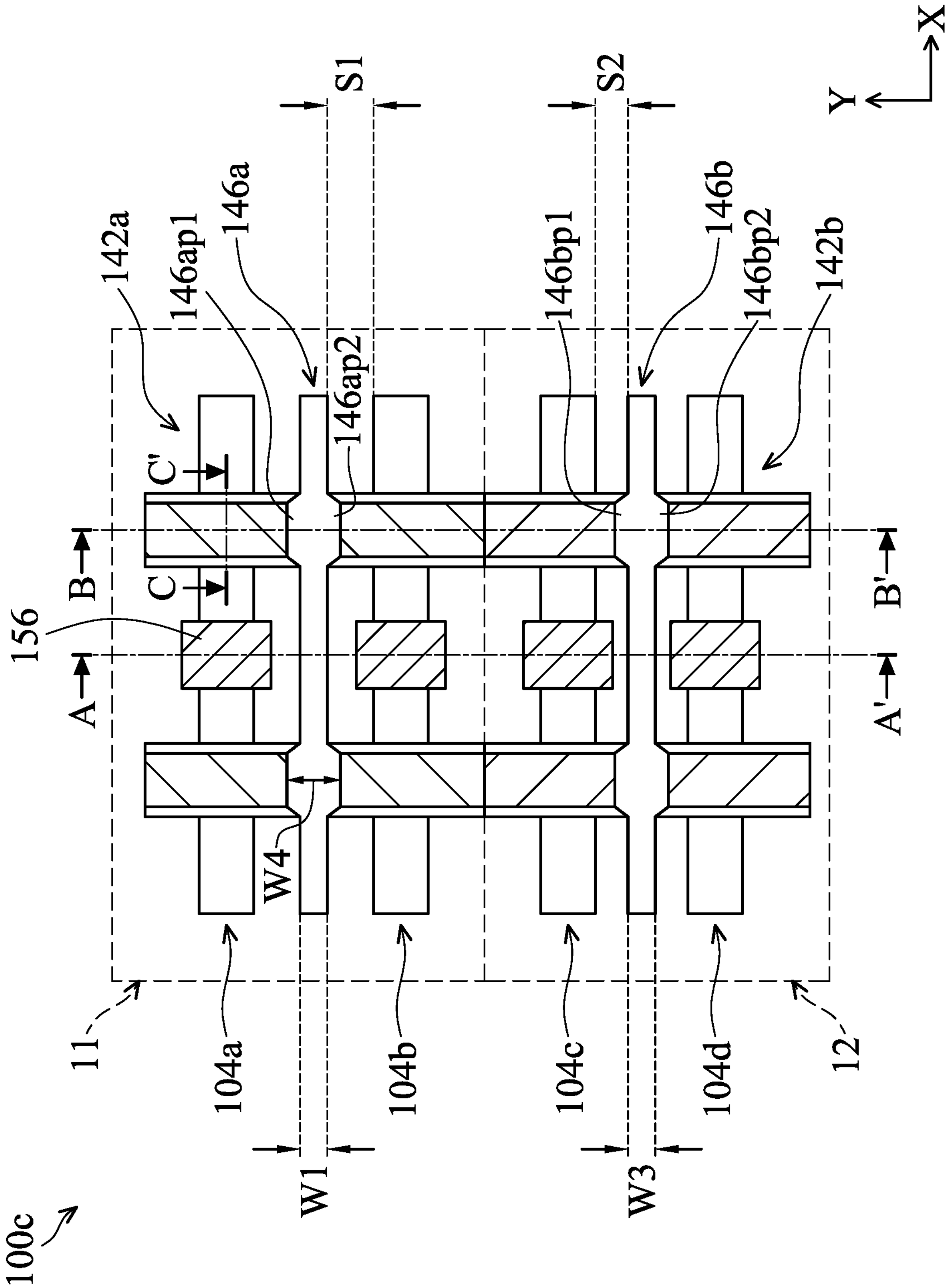
FIG. 6 shows a top-view representation of a semiconductor structure after forming the S/D contact structure, in accordance with some embodiments.

FIG. 6 shows a top-view representation of a semiconductor structure 100*c* after forming the S/D contact structure 156, in accordance with some embodiments. Some features are not shown for clarity. The semiconductor structure 100*c* of FIG. 6 includes elements that are similar to, or the same as, elements of the semiconductor structure 100*b* of FIG. 5, the difference between the FIG. 6 and FIG. 5 is that the first isolation wall structure 146*a* includes a first protruding portion 146*ap*1 and a second protruding portion 146*ap*2 and a main portion 146*am*, and the first protruding portion 146*ap*1 and the second protruding portion 146*ap*2 are closer to the nanostructures 108' than the main portion 146*am*. The first protruding portion 146*ap*1 and the second protruding portion 146*ap*2 are on opposite sidewall surfaces of the main portion 146*am* of the first isolation wall structure 146*a*.

More specifically, the first protruding portion 146*ap*1 is towards the nanostructures 108' of the first fin structure 104*a*. The second protruding portion 146*ap*2 is towards the nanostructures 108' of the second fin structure 104*b*. There is a fourth width W4 measured from the sidewall surface of the first protruding portion 146*ap*1 to the sidewall surface of the second protruding portion 146*ap*2. In some embodiments, the fourth width W4 is greater than the first width W1 of the main portion 146*am*.

Since the first distance S1 is greater than the second distance $S_2$, the risk of damage to the first gate structure 142*a* in the etching process for forming the first isolation wall structure 146*a* may reduce, while the parasitic capacitance may reduce. In addition, the speed of the semiconductor device 100*c* is increased. Therefore, the performance and the manufacturing yield of the semiconductor device 100*c* are improved.

Figure 7:
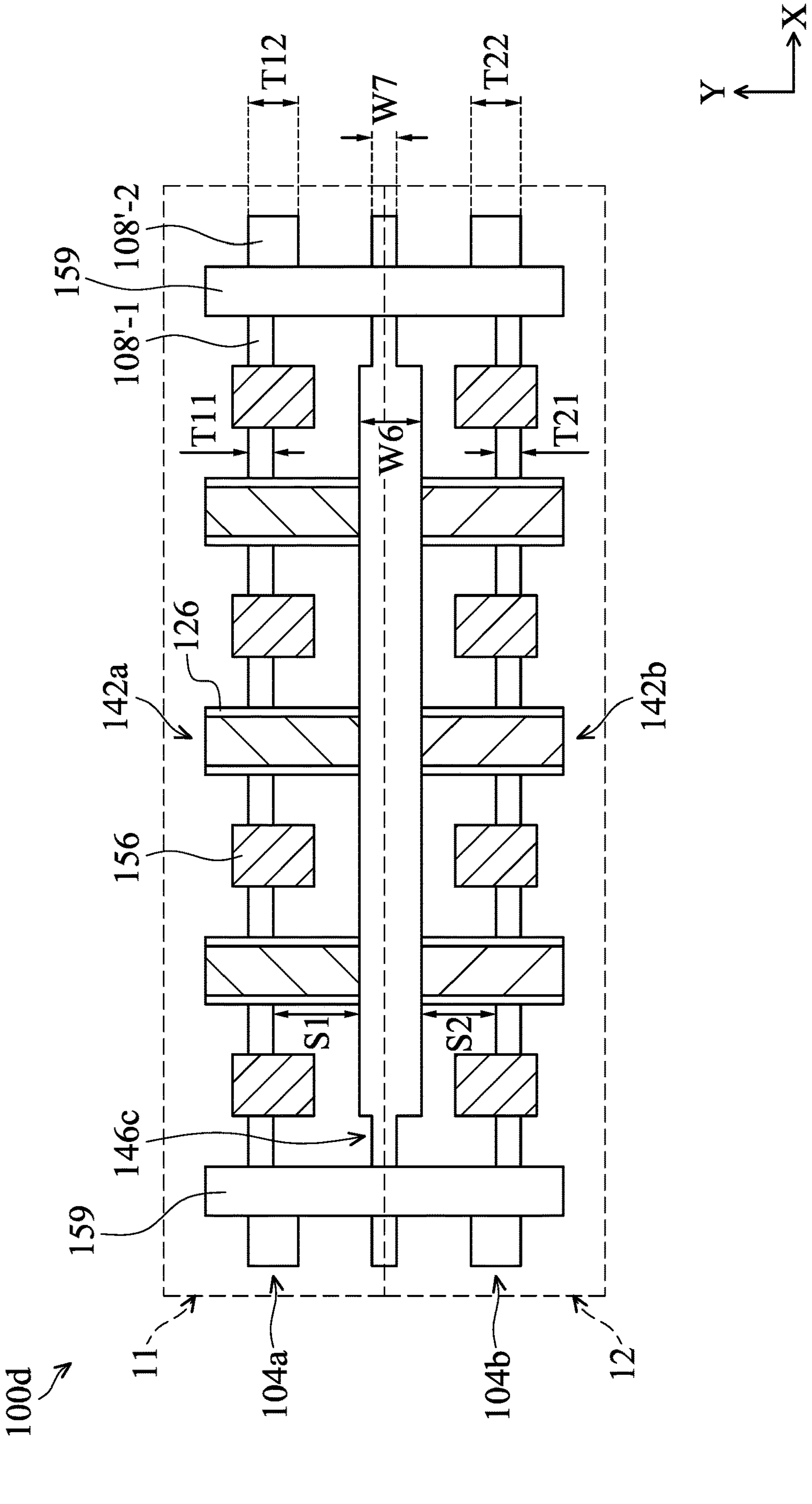
FIG. 7 shows a top-view representation of a semiconductor structure after forming the S/D contact structure, in accordance with some embodiments.

FIG. 7 shows a top-view representation of a semiconductor structure 100*d* after forming the S/D contact structure 156, in accordance with some embodiments. Some features are not shown for clarity. The substrate 102 includes the first region 11 and the second region 12. In some embodiments, the first region 11 is an n-type transistor, and the second region 12 is a p-type transistor. The third isolation wall structure 146*c* is between the first fin structure 104*a* and the second fin structure 104*b*. The third isolation wall structure 146*c* is configured to cut the gate structures. A fin cutting structure 159 is formed parallel to the gate structure 142*a* in the second direction (e.g. the Y-axis).

In the first region 11, the first fin structure 104*a* having a number of nanostructures 108' is formed along the first direction (e.g. the X-axis). In the second region 12, the second fin structure 104*b* having a number of nanostructures 108' is formed along the first direction (e.g. the X-axis). The nanostructures 108' have a first portion 108'-1 and a second portion 108'-2. The first portion 108'-1 is formed on the left sidewall surface of the fin cutting structure 159, and the second portion 108'-2 is formed on the right sidewall surface of the fin cutting structure 159.

In the first region 11, the first portion 108'-1 of the first fin structure 104*a* has a width of T11 in the second direction (e.g. the Y-axis), and the second portion 108'-2 of the first fin structure 104*a* has a width T12 along the second direction (e.g. the Y-axis). In some embodiments, the width T11 of the first portion 108'-1 of the first fin structure 104*a* is smaller than the width T12 of the second portion 108'-2 of the first fin structure 104*a*.

In the second region 12, the first portion 108'-1 of the second fin structure 104*b* has a width T21 in the second direction (e.g. the Y-axis), and the second portion 108'-2 of the second fin structure 104*b* has a width T22 along the second direction (e.g. the Y-axis). In some embodiments, the width T21 of the first portion 108'-1 of the second fin structure 104*b* is smaller than the width T22 of the second portion 108'-2 1 of the second fin structure 104*b*. In some embodiments, the width T21 of the first portion 108'-1 of the second fin structure 104*b* is substantially equal to the width T11 of the first portion 108'-1 of the first fin structure 104*a*.

The isolation wall structure 146*c* is between the first fin structure 104*a* and the second fin structure 104*b*. The isolation wall structure 146*c* has a first sidewall surface and a second sidewall surface, there is the first distance S1 between a sidewall surface of the topmost nanostructure 108' and the first sidewall surface of the third isolation wall 146*c* structure along the second direction. There is the second distance S2 between a sidewall surface of the topmost nanostructure 108' and the second sidewall surface of the third isolation wall structure 146*c* along the second direction, and the first distance S1 is greater than the second distance S2.

The third isolation wall structure 146*c* has longitudinal axes parallel to the first direction (e.g. the X-axis). That is, the dimensions (lengths) of the third isolation wall structure 146*c* in the first direction (e.g. the X-axis) are greater than the dimensions (widths) of the third isolation wall structure 146*c* in the second direction (e.g. the Y-axis). Third isolation wall structure 146*c* has a first portion with a sixth width W6 along the second direction (e.g. the Y-axis) and a second portion with a seventh width W7. In some embodiments, the sixth width W6 is greater than the seventh width W7. In addition, the boundary of the first portion and the second portion of the third isolation wall structure 146*c* extends beyond the sidewall surface of the gate structure 142*a*.

The fin cutting structure 159 is between the first portion 108'-1 and the second portion 108'-2. The fin cutting structure 159 extends from the first fin structure 104*a* to the second fin structure 104*b*. The fin cutting structures 159 have longitudinal axes parallel to the Y direction. That is, the dimensions (lengths) of the fin cutting structures 159 in the Y direction are greater than the dimensions (widths) of the fin cutting structures 159 in the X direction. In some embodiments, the fin cutting structures 159 are configured to prevent leakage between neighboring devices. The fin cutting structures 159 may be also referred to as cut poly gate on oxide definition edge (CPODE) pattern.

The fin cutting structure 159 is made of the dielectric material such as silicon oxide ($SiO_2$), silicon oxynitride (SiON), silicon nitride (SiN), silicon carbon nitride (SiCN), silicon oxycarbonitride (SiOCN), oxygen-doped silicon carbonitride (Si(O)CN), or a combination thereof. In some embodiments, the fin cutting structures 140 include dielectric material with k-value greater than 9, such as LaO, AlO, AlON, ZrO, HfO, ZnO, ZrN, ZrAlO, TiO, TaO, YO, and/or TaCN.

The formation of the fin cutting structures 159 is before the formation of the isolation wall structure 146*c*. For example, in some embodiments, the fin cutting structures 159 is formed before the step of FIGS. 3G-1, 3G-2 and 3G-3 and after the steps of FIGS. 3F-1, 3F-2 and 3F-3.

The formation of the fin cutting structures 159 includes patterning the dummy gate structures 118, the first fin structure 104*a* and the second fin structure 104*b* using photolithography and etching processes to form cutting trenches (where the fin cutting structures 159 are to be formed), depositing a dielectric material for the fin cutting structures 159 to overfill the cutting trenches, in accordance with some embodiments. The etching process may be an anisotropic etching process such as dry plasma etching, an isotropic etching process such as dry chemical etching, remote plasma etching or wet chemical etching, and/or a combination thereof. In some embodiments, the deposition process is ALD, CVD (such as LPCVD, PECVD, HDP-CVD, or HARP), another suitable technique, or a combination thereof. A planarization process is then performed on dielectric material formed until the dummy gate structures 118 and the ILD layer 140 are exposed, in accordance with some embodiments. The planarization may be CMP, etching back process, or a combination thereof.

Since the first distance $S_1$ is greater than the second distance $S_2$, the parasitic capacitance may reduce. In addition, the speed of the semiconductor device **100*d* is increased. Therefore, the performance and the manufacturing yield of the semiconductor device 100*d*** are improved.

Figure 8:
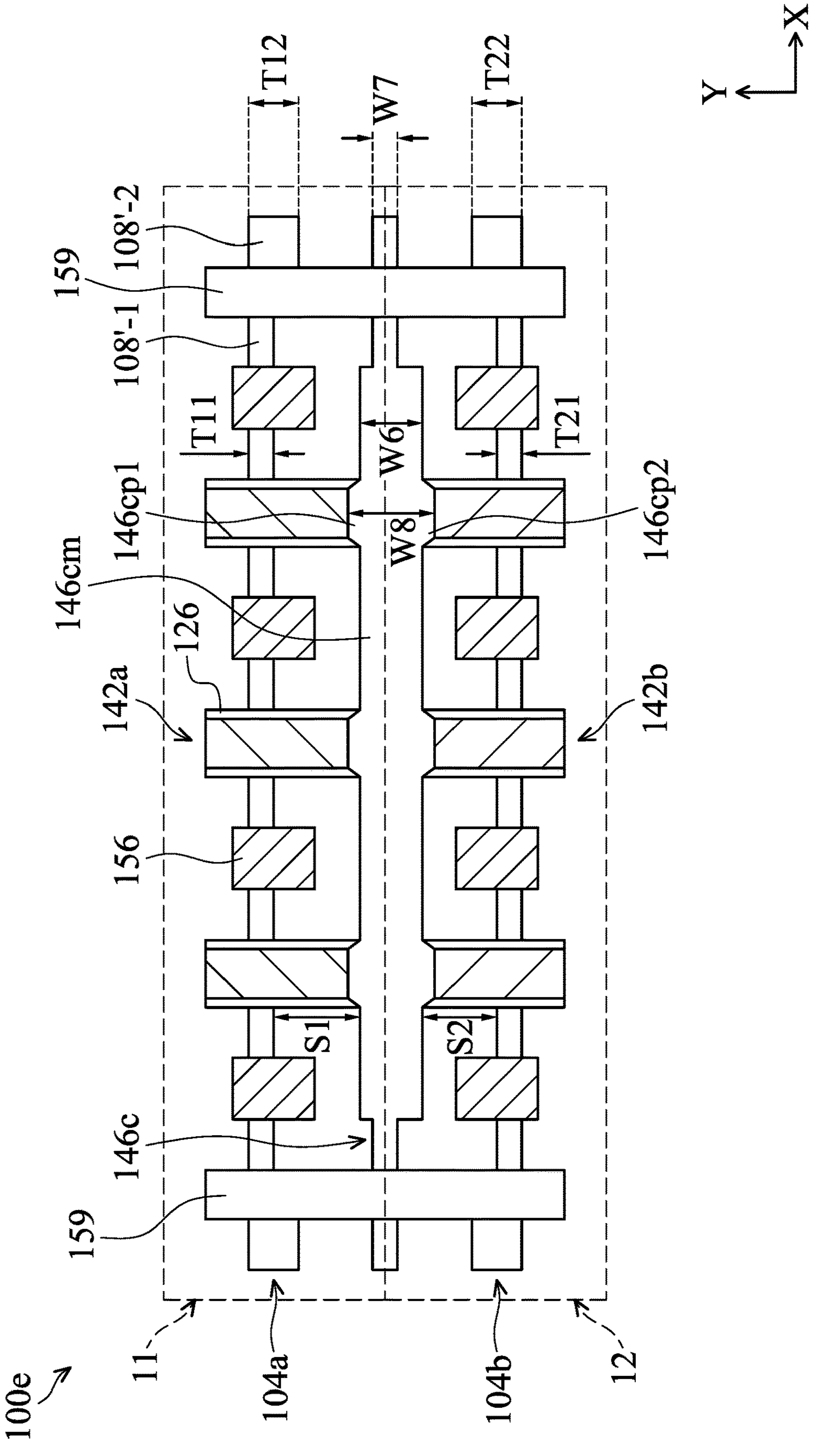
FIG. 8 shows a top-view representation of a semiconductor structure after forming the S/D contact structure, in accordance with some embodiments.

FIG. 8 shows a top-view representation of a semiconductor structure **100*e* after forming the S/D contact structure 156, in accordance with some embodiments. Some features are not shown for clarity. The semiconductor structure 100*e* of FIG. 8 includes elements that are similar to, or the same as, elements of the semiconductor structure 100*d* of FIG. 7, the difference between the FIG. 8 and FIG. 7 is that the third isolation wall structure 146*c* includes a first protruding portion 146*cp*1 and a second protruding portion 146*cp*2 and a main portion 146*cm*, and the first protruding portion 146*cp*1 and the second protruding portion 146*cp*2 are closer to the nanostructures 108' than the main portion 146*cm*. [claim 10] The first protruding portion 146*cp*1 is towards the nanostructures 108' of the first fin structure 104*a*, and the second protruding portion 146*cp*2 is towards the nanostructures 108' of the second fin structure 104*b***.

There is an eighth width W8 measured from the sidewall surface of the first protruding portion **146*cp*1 to the sidewall surface of the second protruding portion 146*cp*2 of the third isolation wall structure 146*c*. In some embodiments, the eighth width W8 is greater than the sixth width W6 of the main portion 146*cm* of the third isolation wall structure 146*c***.

Since the first distance S1 is greater than the second distance S2, the parasitic capacitance may reduce. In addition, the speed of the semiconductor device **100*e* is increased. Therefore, the performance and the manufacturing yield of the semiconductor device 100*e*** are improved.

Figure 9:
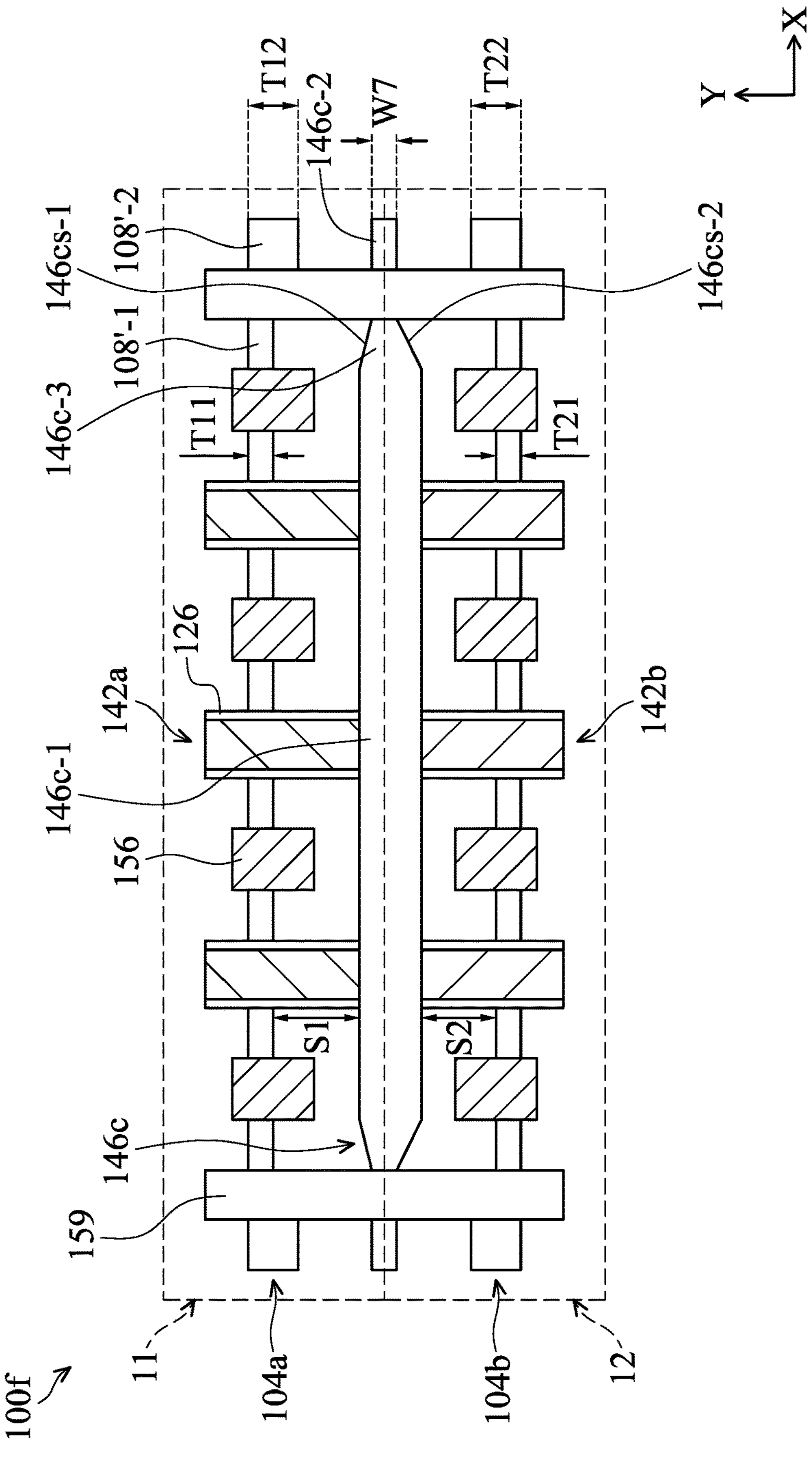
FIG. 9 shows a top-view representation of a semiconductor structure after forming the S/D contact structure, in accordance with some embodiments.

FIG. 9 shows a top-view representation of a semiconductor structure **100*f* after forming the S/D contact structure 156, in accordance with some embodiments. Some features are not shown for clarity. The semiconductor structure 100*f* of FIG. 9 includes elements that are similar to, or the same as, elements of the semiconductor structure 100*d* of FIG. 7, the difference between the FIG. 9 and FIG. 7 is that the third isolation wall structure 146*c* includes a first portion 146*c*-1, a second portion 146*c*-2 and a third portion 146*c*-3. The second portion 146*c*-2 is between the first portion 146*c*-1 and the third portion 146*c*-3. The size of the first portion 146*c*-1 is greater than the size of the third portion 146*c*-3, and the size of the third portion 146*c*-3 is greater than the size of the second portion 146*c*-2**.

The first portion **146*c*-1 and the third portion 146*c*-3 have rectangular shaped structures. The second portion 146*c*-2 has a triangular shape structure. The first sidewall surface 146*cs*1 of the third portion 146*c*-3 is sloped to the sidewall surface of the first portion 146*c*-1. The second sidewall surface 146*cs*2 of the third portion 146*c*-3 is sloped to the sidewall surface of the first portion 146*c*-1**.

Since the first distance $S_1$ is greater than the second distance $S_2$, the parasitic capacitance may reduce. In addition, the speed of the semiconductor device **100*f* is increased. Therefore, the performance and the manufacturing yield of the semiconductor device 100*f*** are improved.

Figure 10:
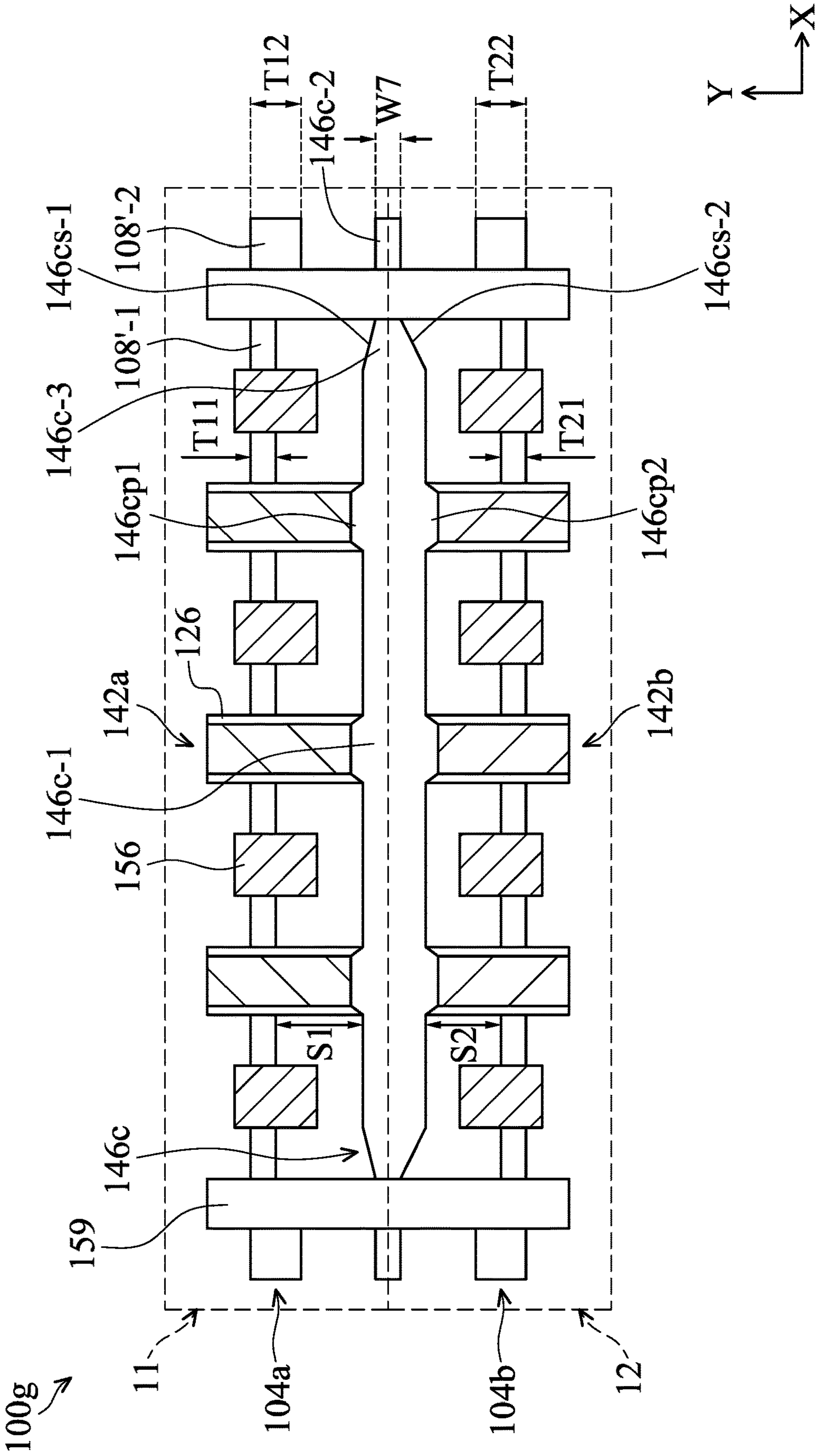
FIG. 10 shows a top-view representation of a semiconductor structure after forming the S/D contact structure, in accordance with some embodiments.

FIG. 10 shows a top-view representation of a semiconductor structure **100*g* after forming the S/D contact structure 156, in accordance with some embodiments. Some features are not shown for clarity. The semiconductor structure 100*g* of FIG. 10 includes elements that are similar to, or the same as, elements of the semiconductor structure 100*f* of FIG. 9, the difference between the FIG. 10 and FIG. 9 is that the third isolation wall structure 146*c* includes the first protruding portion 146*cp*1 and the second protruding portion 146*cp*2 and the main portion 146*cm*, and the first protruding portion 146*cp*1 and the second protruding portion 146*cp*2 are closer to the nanostructures 108' than the main portion 146*cm*. The first protruding portion 146*cp*1 is towards the nanostructures 108' of the first fin structure 104*a*, and the second protruding portion 146*cp*2 is towards the nanostructures 108' of the second fin structure 104*b***.

Since the first distance $S_1$ is greater than the second distance $S_2$, the parasitic capacitance may reduce. In addition, the speed of the semiconductor device **100*g* is increased. Therefore, the performance and the manufacturing yield of the semiconductor device 100*g*** are improved.

Figure 11:
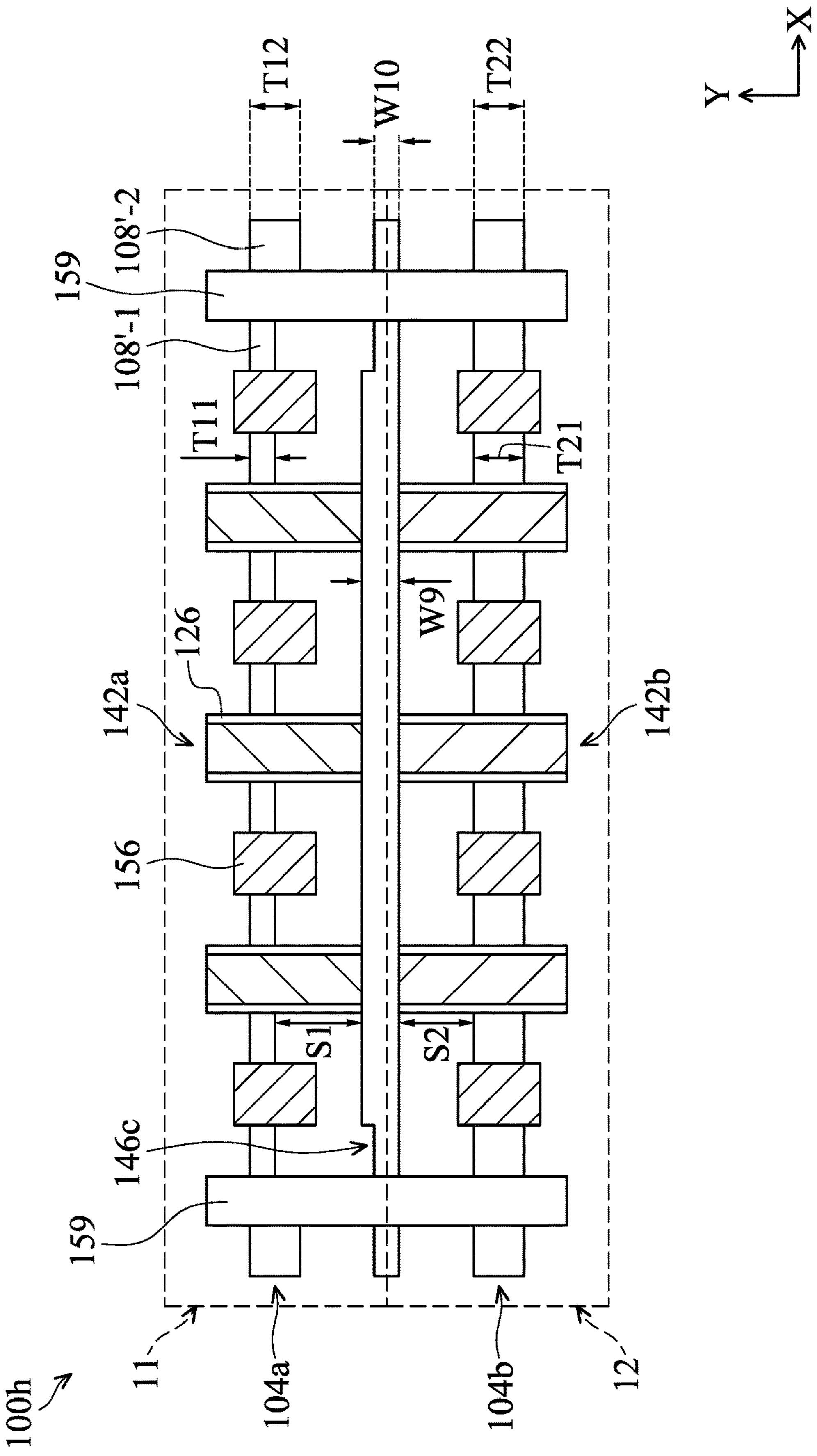
FIG. 11 shows a top-view representation of a semiconductor structure after forming the S/D contact structure, in accordance with some embodiments.

FIG. 11 shows a top-view representation of a semiconductor structure **100*h* after forming the S/D contact structure 156, in accordance with some embodiments. Some features are not shown for clarity. The semiconductor structure 100*h* of FIG. 11 includes elements that are similar to, or the same as, elements of the semiconductor structure 100*d* of FIG. 7, the difference between the FIG. 11 and FIG. 7 is that the dimension of the third isolation wall structure 146*c* is reduced, and the width T21 of the first portion 108'-1 of the second fin structure 104*b* is increased. The width T21 of the first portion 108'-1 of the second fin structure 104*b* is greater than the width T11 of the first portion 108'-1 of the first fin structure 104*a*. In addition, the width T21 of the first portion 108'-1 of the second fin structure 104*b* is substantially equal to the width T22 of the second portion 108'-2 of the second fin structure 104*b***.

Furthermore, the third isolation wall structure **146*c* has a wider portion width a ninth width W9 and a narrower portion width a tenth width W10. The ninth width W9 is greater than the tenth width W10. The majority of the third isolation wall structure 146*c* is located at the first region 11, and therefore an asymmetric structure of the third isolation wall structure 146*c*** is obtained.

It should be noted that there is a first distance S1 between the sidewall surface of the topmost nanostructure 108' and the first sidewall surface of the third isolation wall **146*c* structure along the second direction (e.g. the Y-axis). There is the second distance $S_2$ between the sidewall surface of the topmost nanostructure 108' and the second sidewall surface of the third isolation wall structure 146*c* along the second direction, and the first distance S1 is greater than the second distance S2**.

Since the first distance S1 is greater than the second distance S2, the parasitic capacitance may reduce. In addition, the speed of the semiconductor device **100*h* is increased. Therefore, the performance and the manufacturing yield of the semiconductor device 100*h*** are improved.

Figure 12:
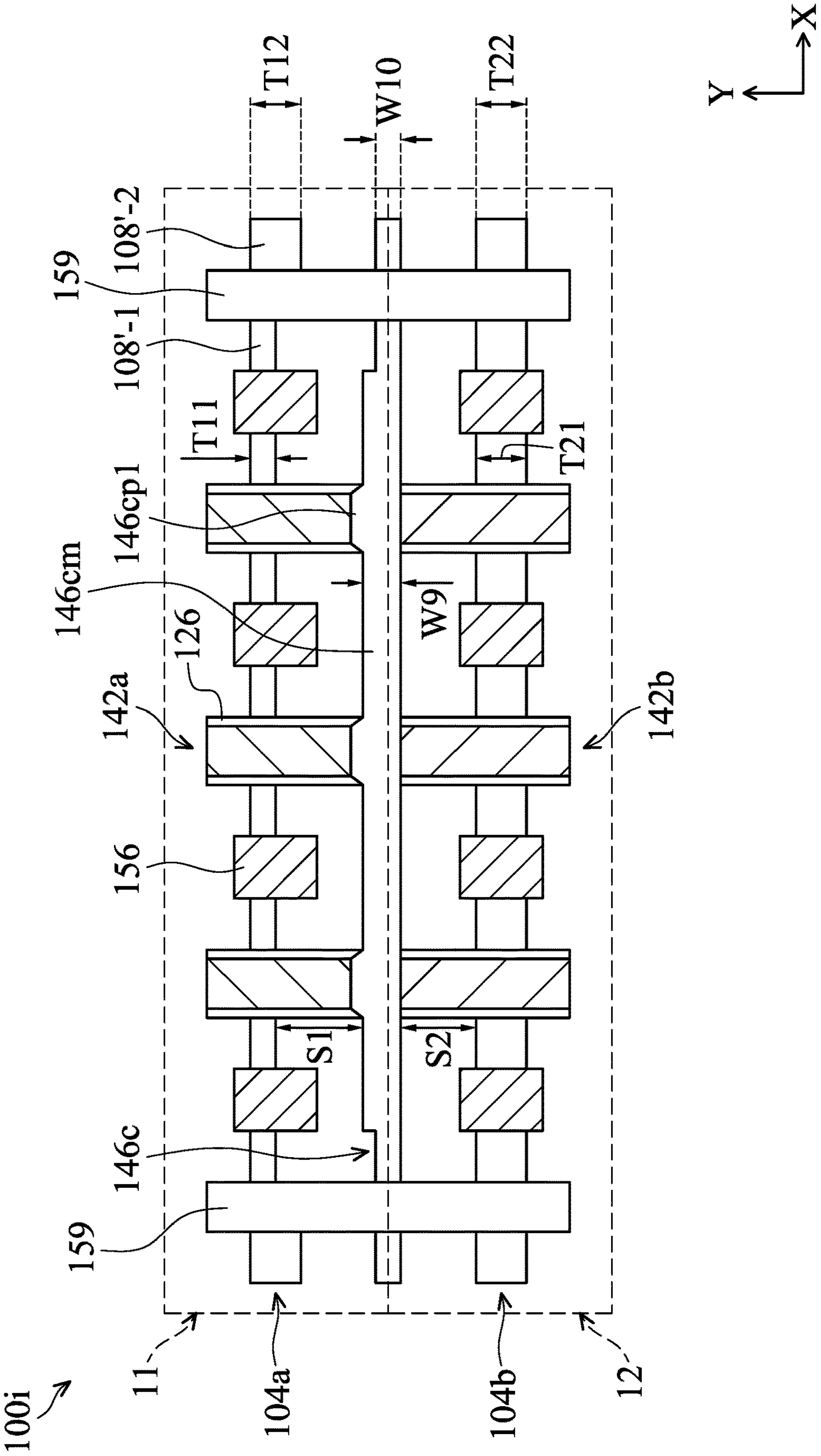
FIG. 12 shows a top-view representation of a semiconductor structure after forming the S/D contact structure, in accordance with some embodiments.

FIG. 12 shows a top-view representation of a semiconductor structure **100*i* after forming the S/D contact structure 156, in accordance with some embodiments. The semiconductor structure 100*i* of FIG. 12 includes elements that are similar to, or the same as, elements of the semiconductor structure 100*h* of FIG. 11, the difference between the FIG. 12 and FIG. 11 is that the third isolation wall structure 146*c* includes the first protruding portion 146*cp*1 and the main portion 146*cm*. The first protruding portion 146*cp*1 is towards the nanostructures 108' of the first fin structure 104*a***.

Since the first distance S1 is greater than the second distance $S_2$, the parasitic capacitance may reduce. In addition, the speed of the semiconductor device 100*i* is increased. Therefore, the performance and the manufacturing yield of the semiconductor device 100*i* are improved.

It should be appreciated that the semiconductor structures 100*a* to 100*g* having different number of nanostructures 108' (or channel layers) in different region for performing different functions described above may also be applied to FinFET structures, although not shown in the figures.

It should be noted that same elements in FIGS. 1A to 12 may be designated by the same numerals and may include similar or the same materials and may be formed by similar or the same processes; therefore such redundant details are omitted in the interest of brevity. In addition, although FIGS. 1A to 12 are described in relation to the method, it will be appreciated that the structures disclosed in FIGS. 1A to 12 are not limited to the method but may stand alone as structures independent of the method. Similarly, although the methods shown in FIGS. 1A to 12 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms “approximately,” “substantially,” “substantial” and “about” describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes a first fin structure and a second fin structure formed over a substrate. The first fin structure includes first nanostructures, and the second fin structure includes second nanostructures along the first direction (e.g. the X-axis). A first gate structure formed over the first nanostructures and a second gate structure formed over the second nanostructures. A first isolation wall structure formed through the first gate structure, and a second isolation wall structure formed through the second gate structure. There is the first distance between the sidewall surface of the topmost first nanostructure and the sidewall surface of the first isolation wall structure along the second direction. There is the second distance between the sidewall surface of the topmost second nanostructure and the sidewall surface of the second isolation wall structure along the second direction, and the first distance is greater than the second distance. Since the first distance is greater than the second distance, the risk of damage to the first gate structure in the etching process for forming the isolation wall structure may reduce, while the parasitic capacitance may reduce. Therefore, the performance and the manufacturing yield of the semiconductor device are improved.

In some embodiments, a semiconductor structure is provided. The semiconductor structure includes a substrate having a first region and a second region. The semiconductor structure includes first nanostructures formed over the first region of the substrate along the first direction, and second nanostructures formed over the second region of the substrate along the first direction. The semiconductor structure also includes a first gate structure formed over the first nanostructures along a second direction, and a second gate structure formed over the second nanostructures along the second direction. The semiconductor structure also includes a first isolation wall structure formed through the first gate structure, and there is a first distance between a sidewall surface of the topmost first nanostructure and a sidewall surface of the first isolation wall structure along the second direction. The semiconductor structure includes a second isolation wall structure formed through the second gate structure, and there is a second distance between a sidewall surface of the topmost second nanostructure and a sidewall surface of the second isolation wall structure along the second direction, and the first distance is greater than the second distance.

In some embodiments, a semiconductor structure is provided. The semiconductor structure includes first nanostructures formed over a substrate along a first direction, and second nanostructures formed over the substrate along the first direction. The semiconductor structure includes a first gate structure formed over the first nanostructures along a second direction, and a second gate structure formed over the second nanostructures along the second direction. The semiconductor structure includes an isolation wall structure between the first gate structure and the second gate structure, and the isolation wall structure has a first sidewall surface and a second sidewall surface. There is a first distance between a sidewall surface of the topmost first nanostructure and the first sidewall surface of the isolation wall structure along the second direction, there is a second distance between a sidewall surface of the topmost first nanostructure and the second sidewall surface of the isolation wall structure along the second direction, and the first distance is greater than the second distance.

In some embodiments, a method for forming a semiconductor structure is provided. The method includes forming first nanostructures over a first region of a substrate along a first direction, and forming second nanostructures formed over a second region of the substrate along the first direction. The method includes forming a first gate structure formed over the first nanostructures along a second direction, and forming a second gate structure formed over the second nanostructures along the second direction. The method also includes forming a first trench in the first gate structure over the first region, and forming a second trench in the second gate structure over the second region. The method includes filling an isolation material into the first trench to form a first isolation wall structure, and filling the isolation material into the second trench to form a second isolation wall structure. There is a first distance between a sidewall surface of the topmost first nanostructure and a sidewall surface of the first isolation wall structure along the second direction, there is a second distance between a sidewall surface of the topmost second nanostructure and a sidewall surface of the second isolation wall structure along the second direction, and the first distance is greater than the second distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
- forming first nanostructures over a first region of a substrate along a first direction;
- second nanostructures formed over a second region of the substrate along the first direction;
- forming a first gate structure formed over the first nanostructures along a second direction;
- forming a second gate structure formed over the second nanostructures along the second direction;
- forming a first trench in the first gate structure over the first region;
- forming a second trench in the second gate structure over the second region;
- filling an isolation material into the first trench to form a first isolation wall structure; and
- filling the isolation material into the second trench to form a second isolation wall structure, wherein there is a first distance between a sidewall surface of a topmost first nanostructure and a sidewall surface of the first isolation wall structure along the second direction, there is a second distance between a sidewall surface of a topmost second nanostructure and a sidewall surface of the second isolation wall structure along the second direction, and the first distance is greater than the second distance.

2. The method for forming the semiconductor structure as claimed in claim 1, wherein forming the first gate structure further comprises forming an N-type metal layer and a silicon (Si) layer on the N-type metal layer.

3. The method for forming the semiconductor structure as claimed in claim 1, wherein the first isolation wall structure comprises a protruding portion and a main portion, and the protruding portion is closer to the first nanostructures than the main portion.

4. The method for forming the semiconductor structure as claimed in claim 1, wherein a first depth of the first trench is smaller than a second depth of the second trench.

5. The method for forming the semiconductor structure as claimed in claim 1, further comprising:
- forming an isolation structure over the substrate, wherein a bottom surface of the first trench is lower than a top surface of the isolation structure.

6. The method for forming the semiconductor structure as claimed in claim 5, wherein a bottom surface of the second trench is lower than the top surface of the isolation structure.

7. The method for forming the semiconductor structure as claimed in claim 1, wherein a first width of the first trench is smaller than a second width of the second trench.

8. The method for forming the semiconductor structure as claimed in claim 1, further comprising:
- forming a first S/D structure adjacent to the first nanostructures;
- forming a second S/D structure adjacent to the second nanostructures; and
- forming the first isolation wall structure between the first S/D structure and the second S/D structure.

9. The method for forming the semiconductor structure as claimed in claim 8, further comprising:
- forming a first S/D contact structure over the first S/D structure;
- forming a second S/D contact structure over the second S/D structure; and
- forming the first isolation wall structure between the first S/D contact structure and the second S/D contact structure.

10. A method for forming a semiconductor structure, comprising:
- forming a first stack structure and a second stack structure over a substrate, wherein the first stack structure and the second stack structure comprises first semiconductor material layers and second semiconductor material layers alternately stacked, respectively;
- forming a dummy gate structure over the first stack structure and the second stack structure;
- removing a portion of the first stack structure to form a first S/D structure;
- removing a portion of the second stack structure to form a second S/D structure;
- forming a dielectric layer over the first S/D structure and the second S/D structure;
- removing a first portion of the dielectric layer to form a first trench adjacent to the first S/D structure;
- removing a second portion of the dielectric layer to form a second trench adjacent to the second S/D structure;
- filling an isolation material into the first trench to form a first isolation wall structure; and
- filling the isolation material into the second trench to form a second isolation wall structure, wherein a height of the first isolation wall structure is smaller than a height of the second isolation wall structure.

11. The method for forming the semiconductor structure as claimed in claim 10, further comprising:
- forming an isolation structure over the substrate, wherein a bottom surface of the first trench is lower than a top surface of the isolation structure.

12. The method for forming the semiconductor structure as claimed in claim 11, further comprising:
- removing a portion of the first semiconductor material layers to form a notch; and
- forming an inner spacer layer in the notch, wherein a bottom surface of the first isolation wall structure is lower than a bottom surface of the inner spacer layer.

13. The method for forming the semiconductor structure as claimed in claim 10, further comprising:
- forming a first S/D contact structure over the first S/D structure;
- forming a second S/D contact structure over the second S/D structure; and
- forming the first isolation wall structure between the first S/D contact structure and the second S/D contact structure.

14. The method for forming the semiconductor structure as claimed in claim 10, further comprising:
- removing a portion of the first stack structure to form a plurality of first nanostructures, wherein a bottom surface of the first isolation wall structure is lower than a bottommost surface of the first nanostructures.

15. A method for forming a semiconductor structure, comprising:
- forming a first stack structure and a second stack structure over a substrate along a first direction;
- forming an isolation structure over the substrate;

forming a dummy gate structure over the first stack structure and the second stack structure along a second direction;

removing a portion of the first stack structure to form a plurality of first nanostructures;

removing a portion of the second stack structure to form a plurality of second nanostructures;

forming a first gate structure formed over the first nanostructures along the second direction;

forming a second gate structure formed over the second nanostructures along the second direction;

removing a portion of the first gate structure to form a first trench, wherein the first trench is along the first direction;

removing a portion of the second gate structure to form a second trench, wherein the second trench is along the first direction, wherein a bottom surface of the second trench is lower than a bottom surface of the first trench;

filling an isolation material into the first trench to form a first isolation wall structure; and filling the isolation material into the second trench to form a second isolation wall structure.

16. The method for forming the semiconductor structure as claimed in claim 15, wherein the first isolation wall structure comprises a first protruding portion and a main portion, and the first protruding portion is closer to the first nanostructures than the main portion in a top-view.

17. The method for forming the semiconductor structure as claimed in claim 16, wherein the first isolation wall structure comprises a second protruding portion, and there is a distance between the first protruding portion and the second protruding portion greater than a width of the main portion along the second direction.

18. The method for forming the semiconductor structure as claimed in claim 15, wherein the first stack structure comprises a fin base structure over the isolation structure, wherein the bottom surface of the first trench is lower than a top surface of the fin base structure.

19. The method for forming the semiconductor structure as claimed in claim 15, wherein a bottom portion of the first isolation wall structure is embedded in the isolation structure.

20. The method for forming the semiconductor structure as claimed in claim 15, wherein a bottom surface of the first isolation wall structure is higher than a bottom surface of the second isolation wall structure.

* * * * *